US011955181B2

(12) United States Patent
Lee

(10) Patent No.: US 11,955,181 B2
(45) Date of Patent: Apr. 9, 2024

(54) MEMORY SYSTEM AND METHOD OF OPERATING THE SAME

(71) Applicant: SK hynix Inc., Icheon-si (KR)

(72) Inventor: Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 191 days.

(21) Appl. No.: 17/551,694

(22) Filed: Dec. 15, 2021

(65) Prior Publication Data

US 2023/0038237 A1 Feb. 9, 2023

(30) Foreign Application Priority Data

Aug. 3, 2021 (KR) .................. 10-2021-0102206

(51) Int. Cl.
*G11C 16/10* (2006.01)
*G11C 16/04* (2006.01)
*G11C 16/08* (2006.01)
*G11C 16/14* (2006.01)
*G11C 16/34* (2006.01)

(52) U.S. Cl.
CPC .......... *G11C 16/10* (2013.01); *G11C 16/0483* (2013.01); *G11C 16/08* (2013.01); *G11C 16/14* (2013.01); *G11C 16/3459* (2013.01)

(58) Field of Classification Search
CPC ..... G11C 16/10; G11C 16/0483; G11C 16/08; G11C 16/14; G11C 16/3459; G11C 2211/5648; G11C 11/5671; G11C 8/14
USPC .................................................. 365/185.11
See application file for complete search history.

(56) References Cited

U.S. PATENT DOCUMENTS

| | | | |
|---|---|---|---|
| 2019/0244674 A1* | 8/2019 | Lee | G11C 16/26 |
| 2020/0075114 A1* | 3/2020 | Lin | G06F 11/1048 |
| 2020/0381068 A1* | 12/2020 | Yu | H01L 24/83 |
| 2021/0191636 A1* | 6/2021 | Ji | G06F 3/0604 |

FOREIGN PATENT DOCUMENTS

| | | |
|---|---|---|
| KR | 1020190034052 A | 4/2019 |
| KR | 1020190094964 A | 8/2019 |

\* cited by examiner

*Primary Examiner* — Fernando Hidalgo
(74) *Attorney, Agent, or Firm* — William Park & Associates Ltd.

(57) ABSTRACT

A memory device includes a memory block, a peripheral circuit, and a control logic. The memory block includes a plurality of string groups respectively connected to a corresponding select line, among a plurality of select lines. The peripheral circuit performs a program operation of data on the memory block. The control logic controls the program operation of the peripheral circuit. The memory block is connected to first to n-th word lines. The control logic is configured to control the peripheral circuit to perform a first program operation on a physical page, among physical pages that are included in a first string group, connected to an i-th word line, performs a second program operation on a physical page that is connected to an (i−1)-th word line, and perform a dummy program operation on a physical page that is connected to an (i+1)-th word line. Here, n is a natural number equal to or greater than 3, and i is a natural number greater than 0 and less than n−1.

12 Claims, 29 Drawing Sheets

MEMORY SYSTEM AND METHOD OF OPERATING THE SAME

CROSS-REFERENCE TO RELATED APPLICATION

The present application claims priority under 35 U.S.C. § 119(a) to Korean patent application number 10-2021-0102206 filed on Aug. 3, 2021, in the Korean Intellectual Property Office, the entire disclosure of which is incorporated by reference herein.

BACKGROUND

1. Technical Field

The present disclosure relates to an electronic device, and more particularly, to a memory system and a method of operating the same.

2. Related Art

A memory device may be formed in a two-dimensional structure in which strings are horizontally arranged on a semiconductor substrate, or in a three-dimensional structure in which the strings are vertically stacked on the semiconductor substrate. A three-dimensional memory device is a memory device designed to resolve a limit of an integration degree of a two-dimensional memory device and may include a plurality of memory cells that are vertically stacked on a semiconductor substrate. A memory system may include a memory device and a controller controlling the memory device.

SUMMARY

According to an embodiment of the present disclosure, a memory device includes a memory block, a peripheral circuit, and a control logic. The memory block includes a plurality of string groups respectively connected to a corresponding select line, among a plurality of select lines. The peripheral circuit performs a program operation of data on the memory block. The control logic controls the program operation of the peripheral circuit. The memory block is connected to first to n-th word lines. The control logic controls the peripheral circuit to perform a first program operation on a physical page, among physical pages that are included in a first string group, connected to an i-th word line, performs a second program operation on a physical page that is connected to an (i−1)-th word line, and perform a dummy program operation on a physical page that is connected to an (i−1)-th word line. Here, n is a natural number equal to or greater than 3, and i is a natural number greater than 0 and less than n−1.

According to another embodiment of the present disclosure, a program operation is performed on a memory block including a plurality of string groups using a re-programming by a method of operating a memory system. The method includes performing a first program operation on a physical page, among a plurality of physical pages that are included in a first string group, connected to an i-th word line and performing a second program operation on a physical page that is connected to an (i−1)-th word line, performing the first program operation on the physical page, among a plurality of physical pages that are included in a second string group, connected to the i-th word line and performing a second program operation on the physical page that is connected to the (i−1)-th word line, performing a dummy program operation on a physical page, among the plurality of physical pages that are included in the first string group, connected to an (i+1)-th word line and performing the second program operation on the physical page that is connected to the i-th word line, and performing the dummy program operation on the physical page, among the plurality of physical pages that are included in the second string group, connected to the (i+1)-th word line and performing the second program operation on the physical page that is connected to the i-th word line. Here, i is a natural number greater than 2.

According to still another embodiment of the present disclosure, a program operation is performed on a memory block including a plurality of string groups using a re-programming method by a method of operating a memory system. The method includes performing a first program operation on physical pages, among a plurality of physical pages that are included in a first string group and a second string group, connected to an i-th word line, performing a second program operation on physical pages, among the plurality of physical pages that are included in the first string group and the second string group, connected to an (i−1)-th word line, performing a dummy program operation on physical pages, among the plurality of physical pages that are included in the first string group and the second string group, connected to an (i+1)-th word line, and performing the second program operation on the physical pages, among the plurality of physical pages that are included in the first string group and the second string group, connected to the i-th word line. Here, i is a natural number greater than 2.

DETAILED DESCRIPTION

Specific structural or functional descriptions of embodiments according to the concept which are disclosed in the present specification or application are Illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure provides a memory system and a method of operating the same that is capable of improving threshold voltage distribution of memory cells after a program.

The present technology may provide a memory system and a method of operating the same that is capable of improving threshold voltage distribution of memory cells after a program.

Figure 1:
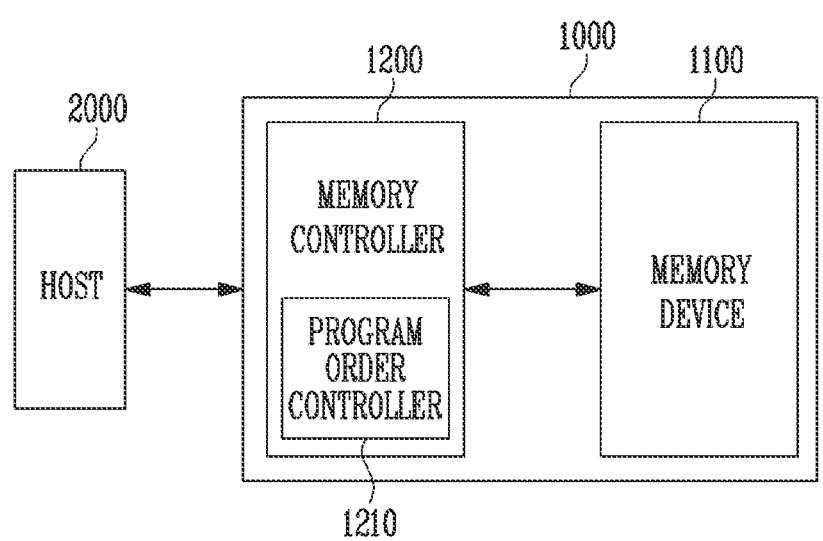
FIG. 1 is a diagram illustrating a memory system according to an embodiment of the present disclosure.

FIG. 1 is a diagram illustrating a memory system according to an embodiment of the present disclosure.

Referring to FIG. 1, the memory system 1000 may include a memory device 1100 in which data is stored, and a memory controller 1200 that controls the memory device 1100 based on a host 2000.

The host 2000 may communicate with the memory system 1000 using an interface protocol, such as a peripheral component interconnect-express (PCI-E), an advanced technology attachment (ATA), a serial ATA (SATA), a parallel ATA (DATA), or a serial attached SCSI (SAS). In addition, the interface protocols, between the host 2000 and the memory system 1000, are not limited to the above-described examples, and may be one of other interface protocols, such as a universal serial bus (USB), a multi-media card (MMC), an enhanced small disk interface (ESDI), or integrated drive electronics (IDE).

The memory controller 1200 may control an overall operation of the memory system 1000 and may control data exchange between the host 2000 and the memory device 1100. For example, the memory controller 1200 may program or read data by controlling the memory device 1100 according to a request of the host 2000. In addition, the memory controller 1200 may store information on main memory blocks and sub-memory blocks that are included in the memory device 1100 and may select the memory device 1100 to perform a program operation on the main memory block or the sub-memory block according to a loaded data amount for the program operation. According to an embodiment, the memory device 1100 may include a (double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), or a flash memory.

The memory controller 1200 may include a program order controller 1210. When a write request is received from the host 2000, the program order controller 1210 may set a program order of a plurality of strings that are included in a selected memory block, among a plurality of memory blocks that are included in the memory device 1100, on which the program operation is to be performed. For example, the program order controller 1210 may set the program order so that the plurality of strings that are included in the selected memory block are sequentially programmed. For example, the program order controller 1210 may set the program order so that a first program operation is sequentially performed on the plurality of strings that are included in the selected memory block, and thereafter, a second program operation is sequentially performed on the plurality of strings.

In an embodiment of the present disclosure, the program order controller 1210 is illustrated and described as being included in the memory controller 1200, but the present disclosure is not limited thereto, and the program order controller 1210 is configured to be included as a component of the memory device 1100.

The memory device 1100 may perform a program, read, or erase operation based on the memory controller 1200.

Figure 2:
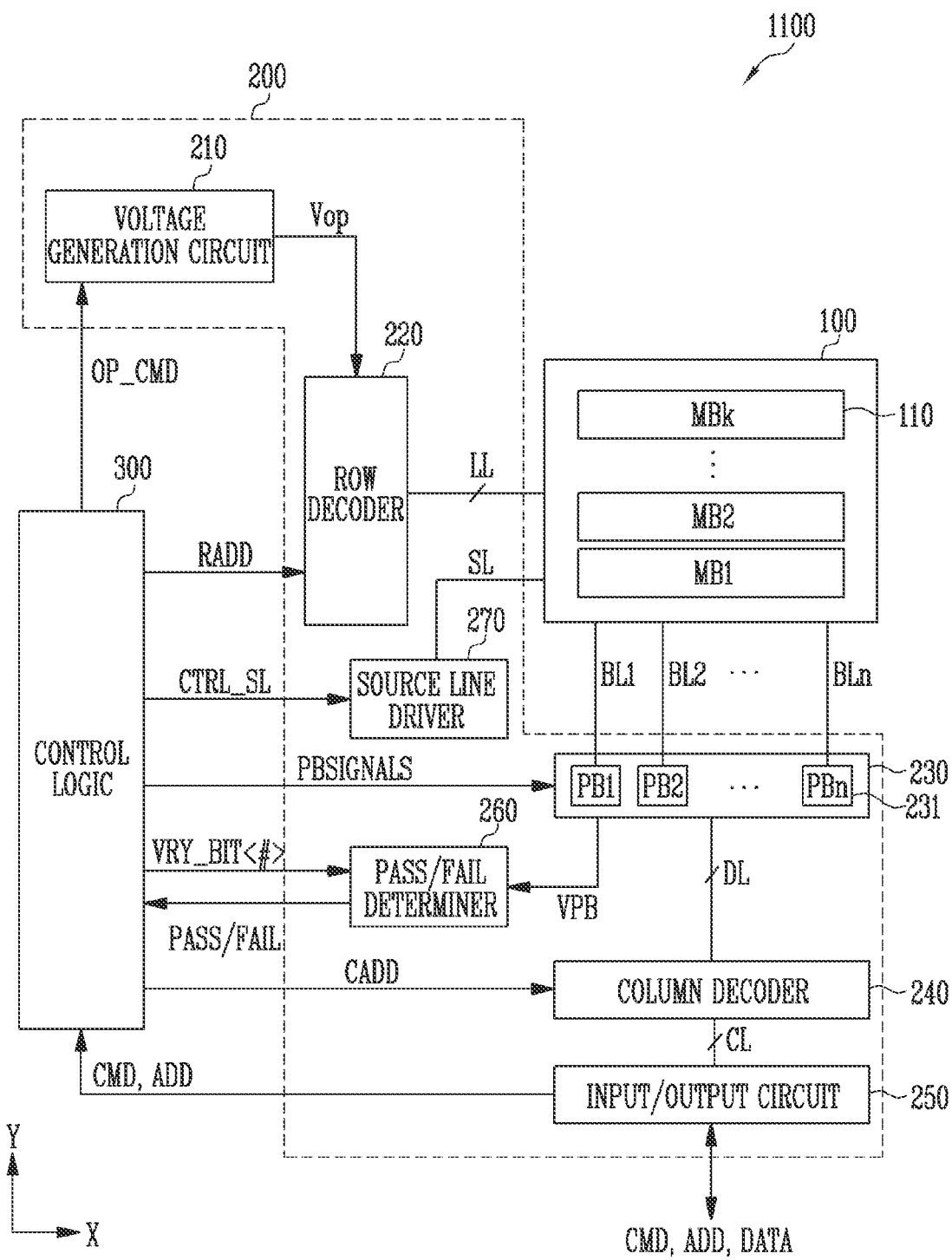
FIG. 2 is a diagram illustrating a memory device of FIG. 1.

FIG. 2 is a diagram illustrating the memory device of FIG. 1.

Referring to FIG. 2, the memory device 1100 may include the memory cell array 100 in which data is stored. The memory device 1100 may include peripheral circuits 200 configured to perform a program operation for storing data in the memory cell array 100, a read operation for outputting the stored data, and an erase operation for erasing the stored data. The memory device 1100 may include a control logic 300 that controls the peripheral circuits 200 according to the control of the memory controller 1200 of FIG. 1.

The memory cell array 100 may include a plurality of memory blocks 110, numbered from MB1 to MBk (k is a positive integer). Local lines LL and bit lines BL1 to BLn (n is a positive integer) may be connected to each of the memory blocks 110, numbered from MB1 to MBk. For example, the local lines LL may include a first select line, a second select line, and a plurality of word lines that are arranged between the first and second select lines. In addition, the local lines LL may include dummy lines that are arranged between the first select line and the word lines, and between the second select line and the word lines. Here, the first select line may be a source select line, and the second select line may be a drain select line. For example, the local lines LL may include the word lines, the drain and source select lines, and source lines SL. For example, the local lines LL may further include the dummy lines. For example, the local lines LL may further include pipe lines. The local lines LL may be connected to the memory blocks 110, numbered from MB1 to MBk, respectively, and the bit lines BL1 to BLn may be commonly connected to the memory blocks 110, numbered from MB1 to MBk. The memory blocks 110, numbered from MB1 to MBk, may be implemented in a two-dimensional or three-dimensional structure. For example, the memory cells may be arranged in a direction that is parallel to a substrate in the memory block 110 of the two-dimensional structure. For example, the memory cells may be stacked in a direction that is perpendicular to the substrate in the memory block 110 of the three-dimensional structure.

The peripheral circuits 200 may be configured to perform the program, read, and erase operations of the selected memory block 110 based on the control logic 300. For example, the peripheral circuits 200 may perform first and second program operations or first to third program operations based on the control logic 300.

As an embodiment, the peripheral circuits 200 may perform the program operation on the selected memory block 110 in a multi-level cell (MLC) program method that is capable of storing two bits of data, a triple level cell (TLC) program method that is capable of programming three bits of data, a quad level cell (QLC) program method that is capable of programming four bits of data, or the like.

The peripheral circuits 200 may perform the program operation in a re-program method that includes the first program operation and the second program operation when data is stored in the memory cells. The first program operation may be performed to program, first, the memory cell to a first target level, and the second program operation may be performed to program, second, the memory cell to a second target level. The first target level and the second target level may be the same threshold voltage level, or the first target level may be a threshold voltage level that is lower than that of the second target level. The above-described re-program method may include first to y-th program operations (y is an integer equal to or greater than 2), and a target level of each program operation may be the same or the target level of the first program operation may be lower than the target level of another program operation.

The peripheral circuits 200 may perform the first program operation to sequentially program the plurality of strings that are included in the selected memory block 110, perform the second program operation to sequentially program the plurality of strings, and perform the third program operation to sequentially program the plurality of strings.

The peripheral circuits 200 may include a voltage generation circuit 210, a row decoder 220, a page buffer group 230, a column decoder 240, an input/output circuit 250, a pass/fail determiner (pass/fail check circuit) 260, and a source line driver 270.

The voltage generation circuit 210 may generate various operation voltages Vop that are used in the program, read, and erase operations in response to an operation signal OP_CMD. In addition, the voltage generation circuit 210 may selectively discharge the local lines LL in response to the operation signal OP_CMD. For example, the voltage generation circuit 210 may generate a program voltage, a verify voltage, pass voltages, a read voltage, a source line voltage, and the like based on the control logic 300.

The row decoder 220 may transfer the operation voltages Vop to the local lines LL that are connected to the selected memory block 110 in response to a row address RADD.

The page buffer group 230 may include a plurality of page buffers 231, numbered from PB1 to PBn, connected to the bit lines BL1 to BLn. The page buffers 231, numbered from PB1 to PBn, may operate in response to page buffer control signals PBSIGNALS. For example, during the program operation, the page buffers 231, numbered from PB1 to PBn, may temporarily store data received through the column decoder 240, and control a potential level of the corresponding bit lines BL1 to BLn according to the stored data. In addition, during the program operation, the page buffers 231, numbered from PB1 to PBn, may be sequentially activated, and may control the potential level of the corresponding bit line according to the temporarily stored data during the activation. At this time, the remaining inactive page buffers apply a program inhibit voltage (for example, a power voltage) to the corresponding bit lines. For example, during the program operation, the page buffer PB1 is activated, the potential level of the bit line BL1 is controlled according to the data that is stored in the page buffer PB1, the page buffer PB2 is activated after the program operation on the memory cell that is connected to the bit line BL1 is completed, and the potential level of the bit line BL2 is controlled according to the data that is stored in the page buffer PB2. As in the above-described operation, the page buffers 231, numbered from PB1 to PBn, are sequentially activated.

The column decoder 240 may transfer data between the input/output circuit 250 and the page buffer group 230 in response to a column address CADD. For example, the column decoder 240 may exchange data with the page buffers 231 through data lines DL, or may exchange data with the input/output circuit 250 through column lines CL.

The input/output circuit 250 may transfer a command CMD and an address ADD received from the memory controller 1200 of FIG. 1 to the control logic 300 or may exchange the data DATA with the column decoder 240.

During the read operation or the verify operation, the pass/fail determiner 260 may generate a reference current in response to an allowable bit VRY_BIT<#>, compare a sensing voltage VPB received from the page buffer group 230 with a reference voltage generated by the reference current, and output a pass signal PASS or a fail signal FAIL.

The source line driver 270 may be connected to the memory cell that is included in the memory cell array 100 through a source line SL and may control a voltage of a source node. For example, during the read or verify operation, the source line driver 270 may electrically connect the source node of the memory cell to a ground node. In addition, during the program operation, the source line driver 270 may apply a ground voltage to the source node of the memory cell. During the erase operation, the source line driver 270 may apply the erase voltage to the source node of the memory cell. The source line driver 270 may receive a source line control signal CTRL_SL from the control logic 300 and control a voltage of the source node based on the source line control signal CTRL_SL.

The control logic 300 may output the operation signal OP_CMD, the row address RADD, the page buffer control signals PBSIGNALS, and the allowable bit VRY_BIT<#> in response to the command CMD and the address ADD and may control the peripheral circuits 200. In addition, the control logic 300 may determine whether the verify operation is passed or failed in response to the pass signal PASS or the fail signal FAIL.

The memory device 1100, according to the above-described embodiment of the present disclosure, sequentially may select and program a plurality of strings that are included in a selected memory block during the program operation on the selected memory block, among the plurality of memory blocks 110, numbered from MB1 to MBk. For example, during the program operation of the MLC method, the first program operation may be performed so that the plurality of strings that are included in the selected memory block 110 are sequentially programmed, and the second program operation may be performed so that the plurality of strings are sequentially programmed. In addition, during the program operation of the MLC method, the first program operation may be performed so that the plurality of strings that are included in the selected memory block 110 are sequentially programmed, the second program operation may be performed so that the plurality of strings are sequentially programmed, and the third program operation may be performed so that the plurality of strings are sequentially programmed.

Figure 3:
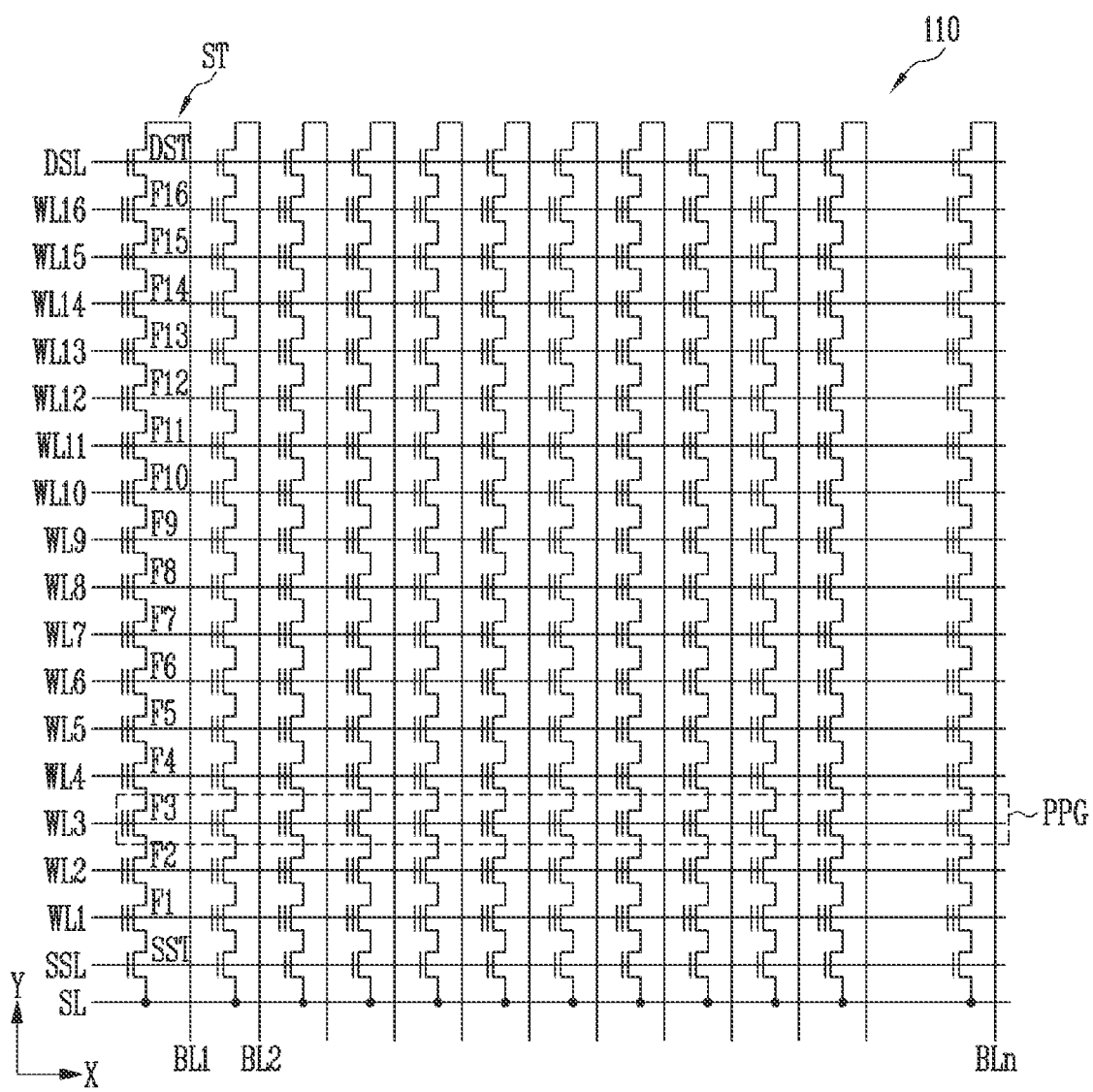
FIG. 3 is a diagram illustrating a memory block of FIG. 2.

FIG. 3 is a diagram illustrating the memory block of FIG. 2.

Referring to FIG. 3, the memory block 110 may be connected to a plurality of word lines that are arranged in parallel with each other between the first select line and the second select line. Here, the first select line may be the source select line SSL, and the second select line may be the drain select line DSL. More specifically, the memory block 110 may include a plurality of strings ST that are connected between the bit lines BL1 to BLn and the source line SL. The bit lines BL1 to BLn may be connected to the strings ST, respectively, and the source line SL may be commonly connected to the strings ST. Since the strings ST may be configured to be identical to each other, a string ST that is connected to the first bit line BL1 will be specifically described, as an example.

The string ST may include a source select transistor SST, a plurality of memory cells F1 to F16, and a drain select transistor DST that are connected in series between the source line SL and the first bit line BL1. However, the invention is not limited thereto. One string ST may include more than one source select transistor SST and drain select transistor DST and may include more than the number of memory cells (F1 to F16) in the present embodiment.

The source of the source select transistor SST may be connected to the source line SL, and the drain of the drain select transistor DST may be connected to the first bit line BL1. The memory cells F1 to F16 may be connected in series between the source select transistor SST and the drain select transistor DST. Gates of the source select transistors SST that are included in the different strings ST may be connected to the source select line SSL, gates of the drain select transistors DST may be connected to the drain select line DSL, and gates of the memory cells F1 to F16 may be connected to the plurality of word lines WL1 to WL16. A group of the memory cells, among the memory cells that are included in different strings ST, connected to the same word line, may be referred to as a physical page PPG. Therefore, the memory block 110 may include the physical pages PPG, corresponding to the number of the word lines WL1 to WL16.

One memory cell may store one bit of data. This is commonly referred to as a single level cell (SLC). In this case, one physical page PPG may store one logical page (LPG) data. One logical page (LPG) data may include data bits of the number of cells that are included in one physical page PPG. In addition, one memory cell may store two or more bits of data. This is commonly referred to as a multi-level cell (MLC). In this case, one physical page PPG may store data of two or more logical page (LPG).

Figure 4:
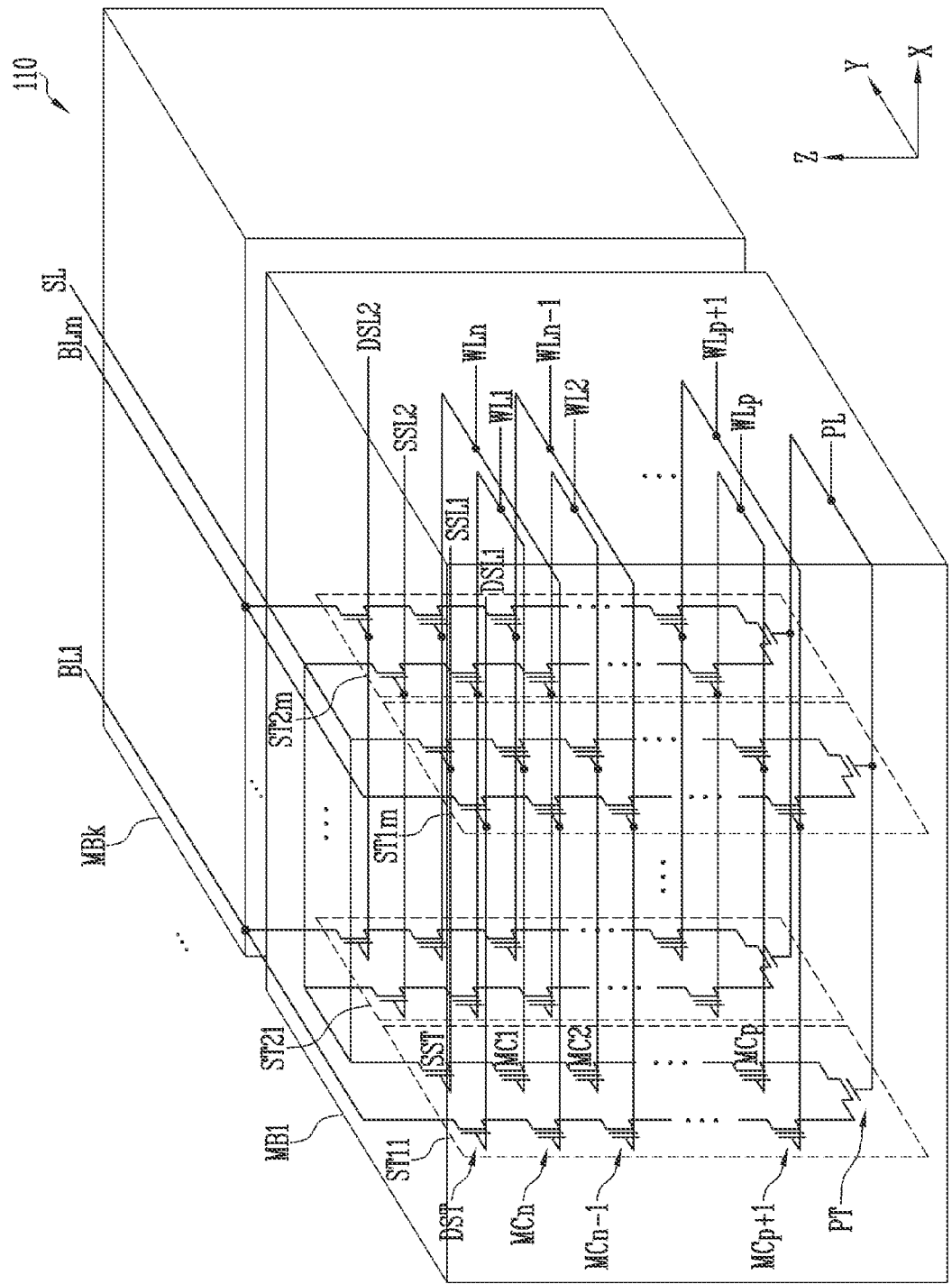
FIG. 4 is a diagram illustrating an embodiment of a memory block configured in a three dimension.

FIG. 4 is a diagram illustrating an embodiment of a memory block configured in a three dimension.

Referring to FIG. 4, the memory cell array 100 may include a plurality of memory blocks 110, numbered from MB1 to MBk. Each of the memory blocks 110 may include a plurality of strings ST11 to ST1m and ST21 to ST2m. As an embodiment, each of the plurality of strings ST11 to ST1m and ST21 to ST2m may be formed in a 'U' shape. In the first memory block MB1, m strings may be arranged in a row direction (X direction). In FIG. 4, two strings are arranged in a column direction (Y direction), but this is for convenience of description, and three or more strings may be arranged in the column direction (Y direction).

Each of the plurality of strings Sill to ST1m and ST21 to ST2m may include at least one source select transistor SST, first to n-th memory cells MC1 to MCn, a pipe transistor PT, and at least one drain select transistor DST.

The source and drain select transistors SST and DST and the memory cells MC1 to MCn may have similar structures. For example, each of the source and drain select transistors SST and DST and the memory cells MC1 to MCn may include a channel film, a tunnel insulating film, a charge trap film, and a blocking insulating film. For example, a pillar for providing the channel film may be provided in each string. For example, a pillar for providing at least one of the channel film, the tunnel insulating film, the charge trap film, and the blocking insulating film may be provided in each string.

The source select transistor SST of each string may be connected between the source line SL and the memory cells MC1 to MCp.

As an embodiment, the source select transistors of the strings that are arranged in the same row may be connected to the source select line that extends in the row direction, and the source select transistors of the strings that are arranged in different rows may be connected to different source select lines. In FIG. 4, the source select transistors of the strings ST11 to ST1m of a first row may be connected to a first source select line SSL1. The source select transistors of the strings ST21 to ST2m of a second row may be connected to a second source select line SSL2.

As another embodiment, the source select transistors of the strings ST11 to ST1m and ST21 to ST2m may be commonly connected to one source select line.

The first to n-th memory cells MC1 to MCn of each string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a vertical direction (Z direction) and may be connected in series between the source select transistor SST and the pipe transistor PT. The (p+1)-th to n-th memory cells MCp+1 to MCn may be sequentially arranged in the vertical direction (Z direction) and may be connected in series between the pipe transistor PT and the drain select transistor DST. The first to p-th memory cells MC1 to MCp and the (p+1)-th to n-th memory cells MCp+1 to MCn may be connected to each other through the pipe transistor PT. Gates of the first to n-th memory cells MC1 to MCn of each string may be connected to the first to the n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. The gate of the pipe transistor PT of each string may be connected to the pipeline PL.

The drain select transistor DST of each string may be connected between the bit line and the memory cells MCp+1 to MCn. The strings that are arranged in the row direction may be connected to the drain select line that extends in the row direction. The drain select transistors of the strings ST11 to ST1m of the first row may be connected to a first drain select line DSL1. The drain select transistors of the strings ST21 to ST2m of the second row may be connected to a second drain select line DSL2.

The strings that are arranged in the column direction may be connected to the bit lines that extend in the column direction. In FIG. 4, the strings ST11 and ST21 of a first column may be connected to the first bit line BL1. The strings ST1m and ST2m of an m-th column may be connected to the m-th bit line BLm.

Among the strings that are arranged in the row direction, the memory cells that are connected to the same word line may configure one page. For example, the memory cells that are connected to the first word line WL1, among the strings ST11 to ST1m of the first row, may configure one page. The memory cells that are connected to the first word line WL1, among the strings ST21 to ST2m of the second row, may configure another page. The strings that are arranged in one row direction will be selected by selecting any one of the drain select lines DSL1 and DSL2. One page of the selected strings will be selected by selecting any one of the word lines WL1 to WLn.

Figure 5:
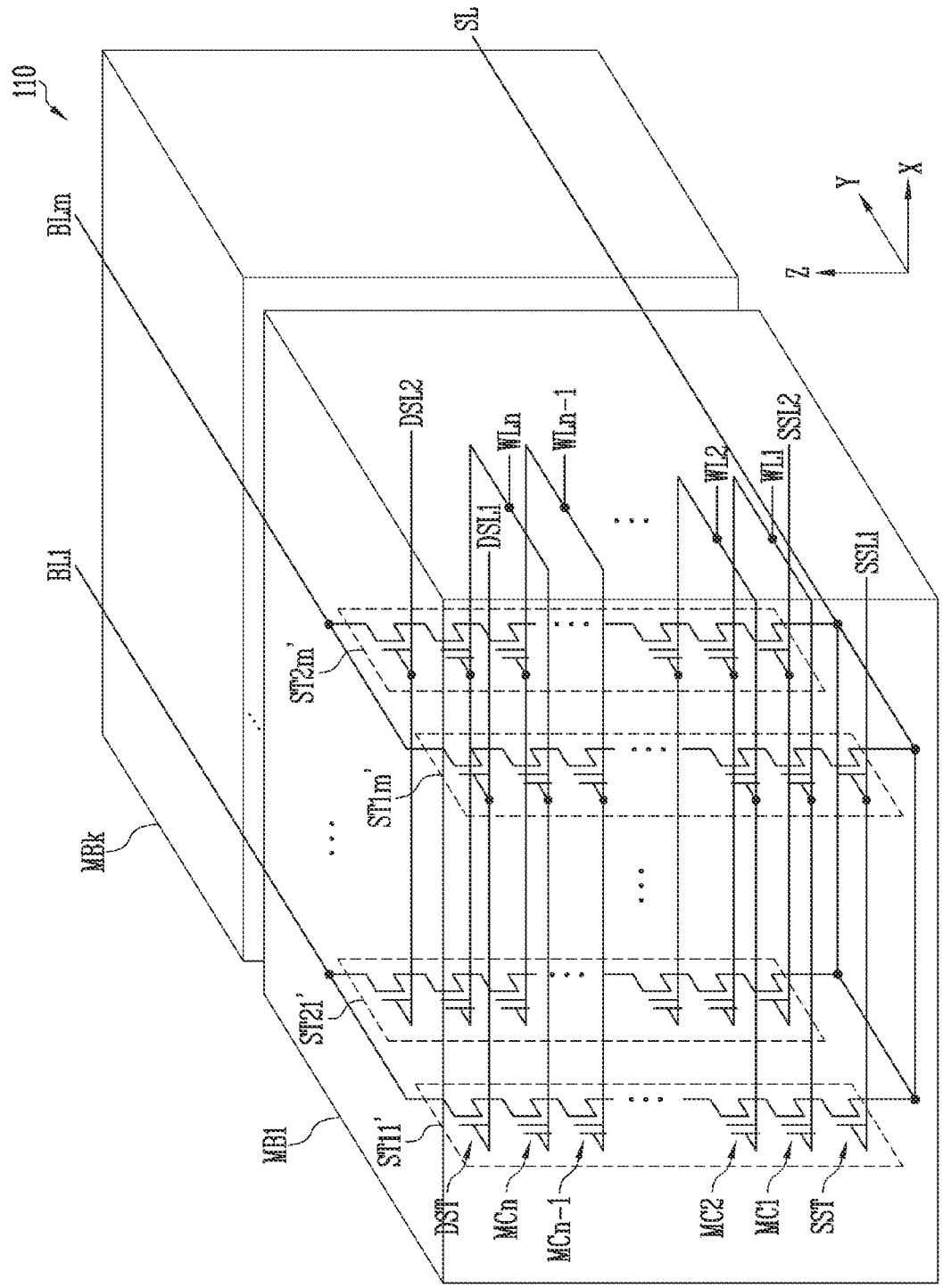
FIG. 5 is a diagram illustrating another embodiment of the memory block configured in the three dimension.

FIG. 5 is a diagram illustrating another embodiment of the memory block configured in the three dimension.

Referring to FIG. 5, the memory cell array 100 may include a plurality of memory blocks 110, numbered from MB1 to MBk. Each of the memory blocks 110 may include a plurality of strings ST11' to ST1m' and ST21' to ST2m'. Each of the plurality of strings ST11' to ST1m' and ST21' to ST2m' may be extended along the vertical direction (Z direction). In the blocks 110, m strings may be arranged in the row direction (X direction). In FIG. 5, two strings are arranged in the column direction (Y direction), but this is for convenience of description, and three or more strings may be arranged in the column direction (Y direction).

Each of the plurality of strings ST11' to ST1m' and ST21' to ST2m' may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings that are arranged in the same row may be connected to the same source select line. The source select transistors of the strings ST11' to ST1m' that are arranged in the first row may be connected to a first source select line SSL1. The source select transistors of the strings ST21' to ST2m' that are arranged in the second row may be connected to a second source select line SSL2. As another embodiment, the source select transistors of the strings ST11' to ST1m' and ST21' to ST2m' may be commonly connected to one source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. Therefore, reliability of the data that is stored in the memory block 110 may be improved.

The drain select transistor DST of each string may be connected between the bit line and the memory cells MC1 to MCn. The drain select transistor DST of the strings that are arranged in the row direction may be connected to the drain select line that extends in the row direction. The drain select transistor DST of the strings ST11' to ST1m' may be connected to a first drain select line DSL1. The drain select transistors DST of the strings ST21' to ST2m' may be connected to a second drain select line DSL2.

That is, the memory block 110 of FIG. 5 may have an equivalent circuit that is similar to that of the memory block 110 of FIG. 4, except that the pipe transistor PT is excluded from each string.

Figure 6:
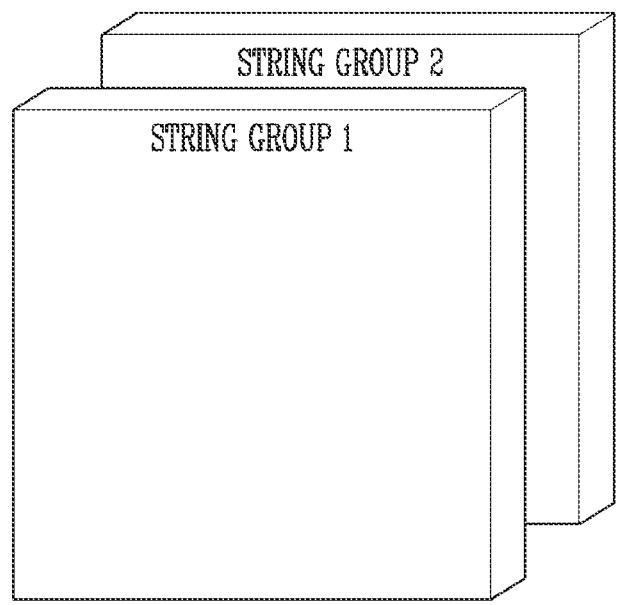
FIG. 6 is a diagram illustrating an example of a string group configuring a memory block.

FIG. 6 is a diagram illustrating an example of the string group configuring the memory block.

Referring to FIG. 6, string groups STRING GROUP 1 and STRING GROUP 2 that are included in the memory block, shown in FIG. 4 or 5, are shown. For example, referring to FIG. 4 together, the string group that is included in the memory block MB1 may be defined as cell strings that share the drain select line or the source select line. For example, in FIG. 4, the cell strings ST11 to ST1m that share the first drain select line DSL1 and the first source select line SSL1 may configure the first string group STRING GROUP 1. Meanwhile, the cell strings ST21 to ST2m that share the second drain select line DSL2 and the second source select line SSL2 may configure the second string group STRING GROUP 2.

As another example, in FIG. 5, the cell strings ST11' to ST1m' that share the first drain select line DSL1 and the first source select line SSL1 may configure the first string group STRING GROUP 1. Meanwhile, the cell strings ST21' to ST2m' that share the second drain select line DSL2 and the second source select line SSL2 may configure the second string group STRING GROUP 2. The memory block may include the two string groups STRING GROUP 1 and STRING GROUP 2 that are disposed in the +X direction. Each of the string groups STRING GROUP 1 and STRING GROUP 2 may include the cell strings that are arranged in the row direction (that is, the +Y direction). Meanwhile, each of the string groups STRING GROUP 1 and STRING GROUP 2 may include pages that are arranged in a string direction (that is, the +Z direction). A more detailed configuration of each string group is described later with reference to FIGS. 7 and 8.

Figure 7:
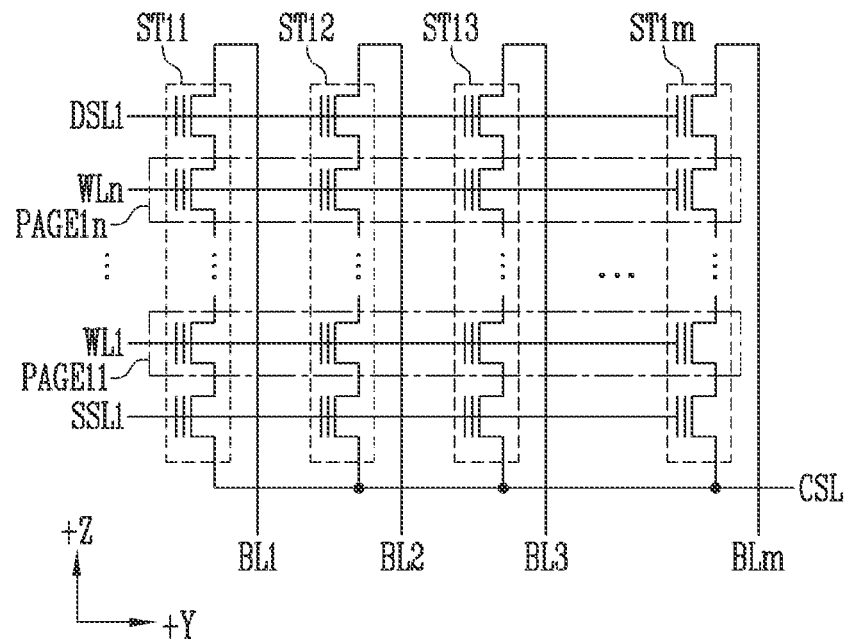
FIG. 7 is a circuit diagram illustrating a first string group, among string groups, shown in FIG. 6 in more detail.

FIG. 7 is a circuit diagram illustrating the first string group, among the string groups, shown in FIG. 6 in more detail. Since the second string group may also have the same configuration as the first string group, a detailed circuit diagram of the second string group is omitted.

Referring to FIG. 7, the first string group STRING GROUP 1 may include the cell strings ST11 to ST1m that share the first drain select line DSL1 and the first source select line SSL1. That is, the cell strings ST11 to ST1m that are included in the first string group STRING GROUP 1 may be commonly connected to the first drain select line DSL1 and the first source select line SSL1. The cell strings ST11 to ST1m may be arranged in the +Y direction in the first string group STRING GROUP 1. The respective cell strings ST11 to ST1m may be connected to the corresponding bit lines BL1 to BLm.

Meanwhile, the first string group STRING GROUP 1 may include pages PAGE11 to PAGE1n that are arranged in the +Z direction. Each of the pages PAGE11 to PAGE1n may be a set of the memory cells that is connected to the corresponding word lines WL1 to WLn. Therefore, each of the pages PAGE11 to PAGE1n may be referred to as a "physical page".

In a case in which the memory device includes the SLC, one physical page may correspond to one logical page. In a case in which the memory device includes the MLC, one physical page may correspond to two logical pages. In a case in which the memory device includes the TLC, one physical page may correspond to three logical pages. In a case in which the memory device includes the QLC, one physical page may correspond to four logical pages.

Although not shown in FIG. 7, the second string group STRING GROUP 2 may also include the cell strings ST21 to ST2m that are arranged in the +Y direction. Meanwhile, the second string group STRING GROUP 2 may include pages PAGE21 to PAGE2n that are arranged in the +Z direction.

Figure 8:
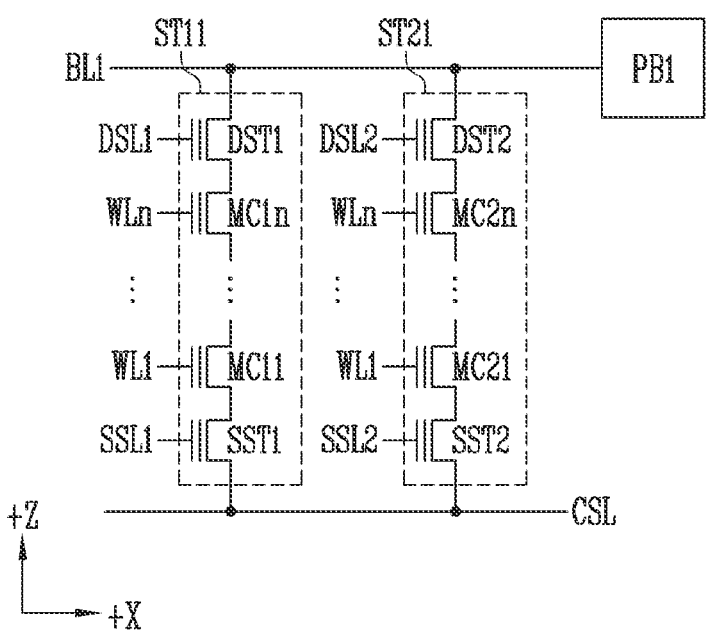
FIG. 8 is a circuit diagram illustrating a portion of the cell string that is included in first and second string groups.

FIG. 8 is a circuit diagram illustrating a portion of the cell string that is included in the first and second string groups.

Referring to FIG. 8, the cell string ST11 that is included in the first string group STRING GROUP 1 and the cell string ST21 that is included in the second string group STRING GROUP 2 are shown. FIG. 8 may be a circuit diagram illustrating the memory block, shown in FIG. 6, in the +Y direction. Therefore, in FIG. 8, the cell strings ST12 to ST1m that are included in the first string group STRING GROUP 1 and the cell strings ST22 to ST2m that are included in the second string group STRING GROUP 2 are not shown.

The cell string ST11 of the first string group STRING GROUP 1 may include the memory cells MC11 to MC1n that are connected between the first drain select transistor DST1 and the first source select transistor SST1. The cell string ST21 of the second string group STRING GROUP 2 may include the memory cells MC21 to MC2n that are connected between the second drain select transistor DST2 and the second source select transistor SST2.

The cell string ST11 that is included in the first string group STRING GROUP 1 and the cell string ST21 that is included in the second string group STRING GROUP 2 may be commonly connected to the bit line BL1. Meanwhile, the page buffer PB1 may be commonly connected to the bit line BL1. That is, the cell string ST11 that is included in the first string group STRING GROUP 1 and the cell string ST21 that is included in the second string group STRING GROUP 2 may share the page buffer P31.

Figure 9A:
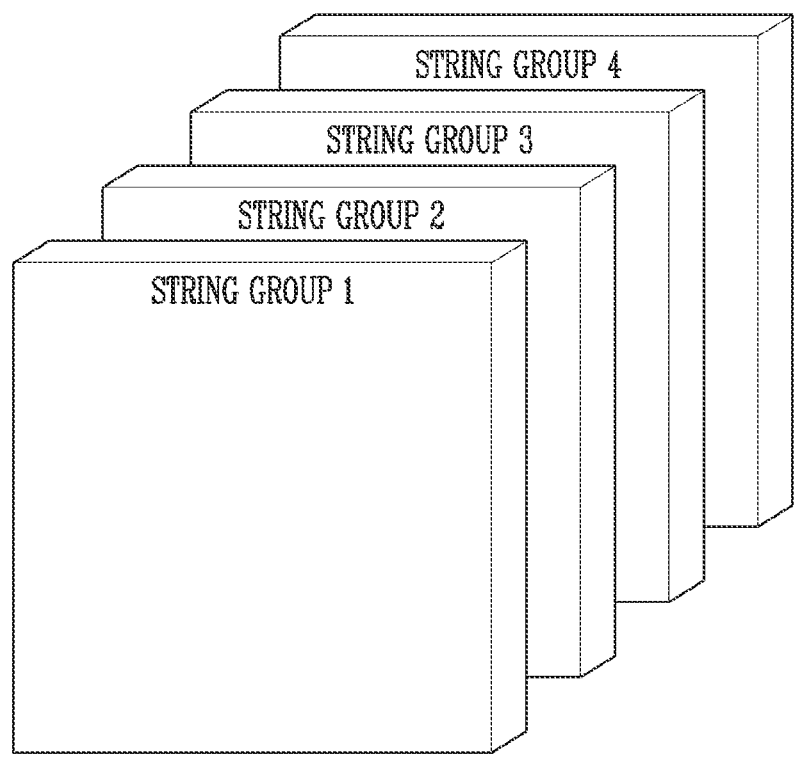
FIG. 9A is a diagram illustrating another example of a string group configuring the memory block.

FIG. 9A is a diagram illustrating another example of the string group configuring the memory block. Meanwhile, FIG. 9B is a circuit diagram illustrating a portion of a cell string that is included in first to fourth string groups.

Referring to FIG. 9A, the memory block may include four string groups STRING GROUP 1 to STRING GROUP 4. As described above, the string group that is included in the memory block may be defined as the cell strings that share the drain select line or the source select line. The memory block, shown in FIG. 6, may include two string groups, but the memory block may be configured to include the four string groups as shown in FIG. 9A.

Figure 9B:
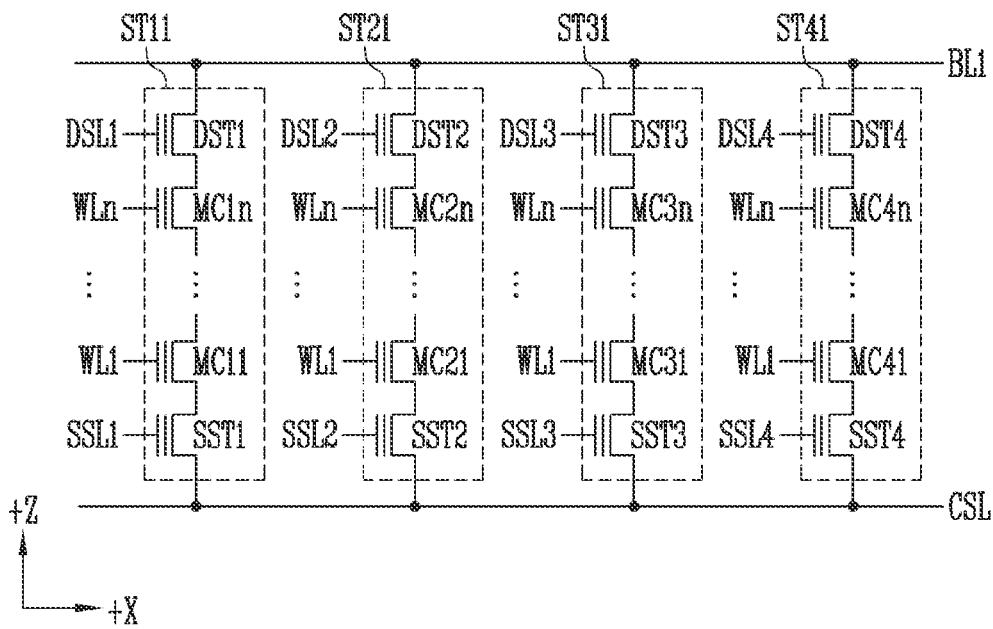
FIG. 9B is a circuit diagram illustrating a portion of a cell string that is included in first to fourth string groups.

Referring to FIG. 9B, the cell string ST11 that is included in the first string group STRING GROUP 1, the cell string ST21 that is included in the second string group STRING GROUP 2, the cell string ST31 that is included in the third string group STRING GROUP 3, and the cell string ST41 that is included in the fourth string group STRING GROUP 4 are shown. FIG. 9B may be a circuit diagram illustrating the memory block, shown in FIG. 9A, in the +Y direction.

The cell string ST11 of the first string group STRING GROUP 1 may include the memory cells MC11 to MC1n that are connected between the first drain select transistor DST1 and the first source select transistor SST1. The cell string ST21 of the second string group STRING GROUP 2 may include the memory cells MC21 to MC2n that are connected between the second drain select transistor DST2 and the second source select transistor SST2. The cell string ST31 of the third string group STRING GROUP 3 may include the memory cells MC31 to MC3n that are connected between the third drain select transistor DST3 and the third source select transistor SST3. The cell string ST41 of the fourth string group STRING GROUP 4 may include the memory cells MC41 to MC4n that are connected between the fourth drain select transistor DST4 and the fourth source select transistor SST4.

The memory block with the two string groups is described with reference to FIGS. 6 to 8. However, as shown in FIGS. 9A and 9B, the memory block with the four string groups may also be configured.

Figure 10:
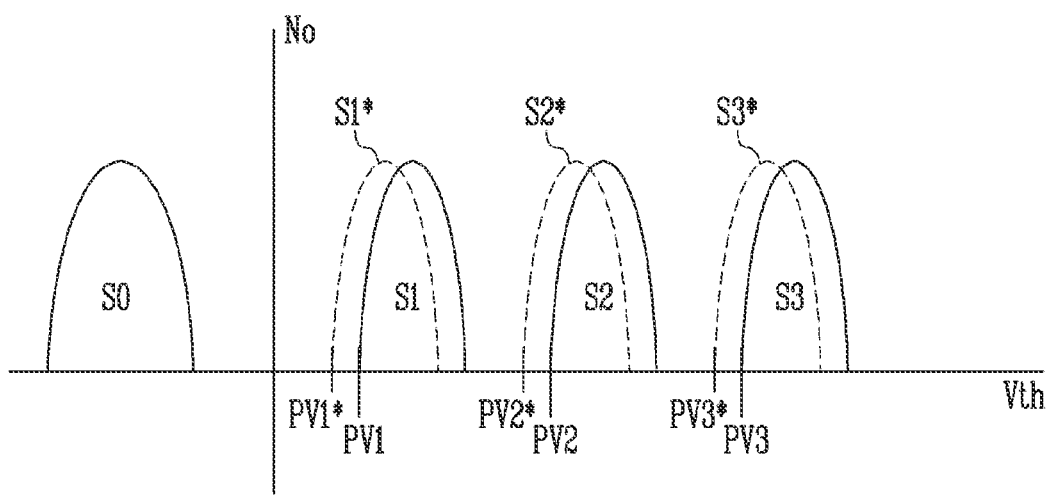
FIG. 10 is a threshold voltage distribution diagram illustrating a program operation of a memory system according to an embodiment of the present disclosure.

FIG. 10 is a threshold voltage distribution diagram illustrating a program operation of a memory system according to an embodiment of the present disclosure. Referring to FIG. 10, the memory system according to an embodiment of the present disclosure programs memory cells in a re-program method.

When a write request and data are input from the host 2000, the memory controller 1200 may generate a command CMD to control a write operation of the memory device 1100 in response to the write request and may convert an address that is received together with the write request into an address of the memory device 1100 to generate a converted address ADD.

In response to the write request, the program order controller 1210 of the memory controller 1200 may set the program order of the plurality of strings that are included in the selected memory block, among the plurality of memory blocks that are included in the memory device 1100, on which the program operation is to be performed. For example, the program order controller 1210 may set the program order so that the plurality of strings that are included in the selected memory block are sequentially selected and programmed.

The memory controller 1200 may transmit the command CMD, the data, and the address ADD to the memory device 1100.

In response to the command CMD and the address ADD, the control logic 300 of the memory device 1100 may output the operation signal OP_CMD, the row address RADD, and the page buffer control signals PBSIGNALS to cause the peripheral circuits 200 to perform the first program operation on a selected physical page configured of the memory cells that are connected to the word line WL1, among the selected memory blocks (for example, MB1). Thereafter, after performing the first program or the second program operation on another physical page, the second program operation on the selected physical page may be performed.

Referring to FIG. 10, the first program operation may maintain a threshold voltage of the memory cell of an erase state S0 as it is or programs the threshold voltage of the memory cell to a state higher than target levels PV1*, PV2*, and PV3*. At this time, the target levels PV1*, PV2*, and PV3* of the first program operation may be lower than the target levels PV1, PV2, and PV3 of the second program operation. In addition, as another embodiment, the target levels PV1*, PV2*, and PV3* of the first program operation and the target levels PV1, PV2, and PV3 of the second program operation may be identically set. As a result of the first program operation, the memory cells may be programmed to have one program state, among S0, S1*, S2*, and S3*. Meanwhile, the second program operation may be an operation of maintaining the threshold voltage of the memory cell after the first program operation as the erase state S0 or programming the threshold voltage of the memory cell to the state higher than the target levels PV1, PV2, and PV3. As a result of the second program operation, the memory cells may be programmed to have one program state, among S0, S1, S2, and S3.

In the embodiment of the present application, the first and second program operations may be included in the re-program operation. However, the invention is not limited thereto. The re-program operation may include first to y-th (y is an integer equal to or greater than 2) program operations, and the target level of each program operation may be equal to each other, or the target level of the first program operation may be lower than the target level of another program operation. The threshold voltage distribution of the memory cells may be improved with the re-program operation.

Meanwhile, the re-program method is described as an example with reference to FIG. 10, but the re-program method may also be applied to the TLC or the QLC.

FIGS. 11A to 11F are diagrams illustrating a method of operating a memory device according to an embodiment of the present disclosure.

FIGS. 11A to 11F show a plurality of pages that are connected to the first to n-th word lines WL1 to WLn. More specifically, a first string group ST1 may include first to n-th physical pages. The first to n-th physical pages may be programmed in a re-program method. That is, in order to program one physical page, the first program operation and the second program operation may be performed. A verify voltage of the first program operation may be less than a verify voltage of the second program operation.

Figure 11A:
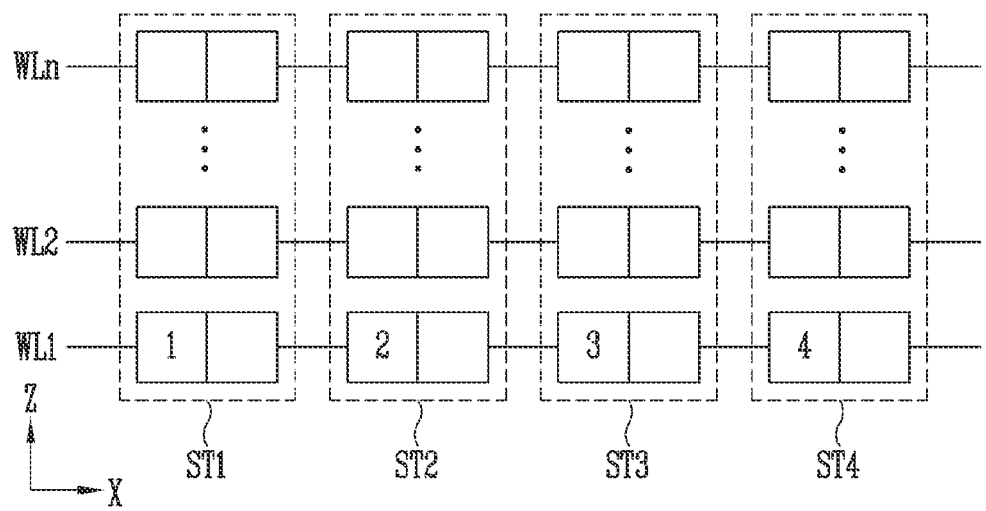
FIGS. 11A to 11F are diagrams illustrating a method of operating a memory device according to an embodiment of the present disclosure.
Figure 11B:
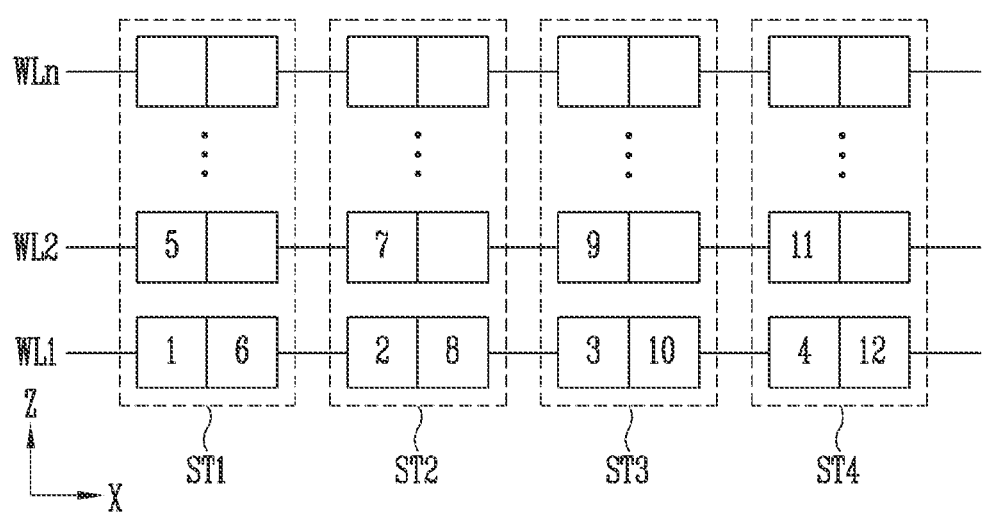

In FIGS. 11A to 11B, one physical page that is connected to each of word lines is shown as two connected quadrangles in order to indicate such characteristics. Meanwhile, numbers that are written in each quadrangle indicate a program order of data.

More specifically, referring to FIG. 11A, the first program operation may be performed on a physical page, among n physical pages that are included in the first string group ST1 (1), connected to the first word line WL1. In order to indicate this, in FIG. 11A, a number "1" is written in a first quadrangle of two quadrangles that indicates the physical page, among the physical pages of the first string group ST1, connected to the first word line WL1. This means that the first program operation may be performed on the first physical page of the first string group ST1, among the physical pages, shown in FIG. 11A. Meanwhile, in FIG. 11A, the number "1" is shown in the first quadrangle, among the two quadrangles, indicating the physical page, among the physical pages of the first string group ST1, connected to the first word line WL1, and a second quadrangle is empty. This means that only the first program operation may be performed on the physical page, connected to the first word line WL1, among the physical pages of the first string group ST1 and the second program operation is not performed.

Referring again to FIG. 11A, after the first program operation is performed on the physical page of the first string group ST1 that is connected to the first word line WL1 (1), the first program operation may be performed on a physical page of a second string group ST2 that is connected to the first word line WL1 (2). Thereafter, the first program operation may be performed on a physical page of a third string group ST3 that is connected to the first word line WL1 (3), and the first program operation may be performed on a physical page of a fourth string group ST4 that is connected to the first word line WL1 (4).

Referring to FIG. 11B, a number "5" is written in a first quadrangle, among two quadrangles, indicating the physical page of the first string group ST1 that is connected to the second word line WL2. Therefore, after the first program operation is performed on a physical page of a fourth string group ST4 that is connected to the first word line WL1 (4), the first program operation may be performed on the physical page of the first string group ST1 that is connected to the second word line WL2. Thereafter, a number "6" is written in a second quadrangle, among the two quadrangles, indicating the physical page of the first string group ST1 that is connected to the first word line WL1. Therefore, after the first program operation is perform led on the physical page of the first string group ST1 that is connected to the second word line WL2 (5), the second program operation may be performed on the physical page of the first string group ST1 that is connected to the first word line WL1.

In a similar method, after the second program operation is performed on the physical page of the first string group ST1 that is connected to the first word line WL1 (6), the first program operation is performed on the physical page of the second string group ST2 that is connected to the second word line WL2 (7), and the second program operation may be performed on the physical page of the second string group ST2 that is connected to the first word line WL1 (8).

Thereafter, the first program operation may be performed on the physical page of the third string group ST3 that is connected to the second word line WL2 (9), and the second program operation may be performed on the physical page of the third string group ST3 that is connected to the first word line WL1 (10).

Finally, the first program operation may be performed on the physical page of the fourth string group ST4 that is connected to the second word line WL2 (11), and the second program operation may be performed on the physical page of the fourth string group ST4 that is connected to the first word line WL1 (12).

Figure 11C:
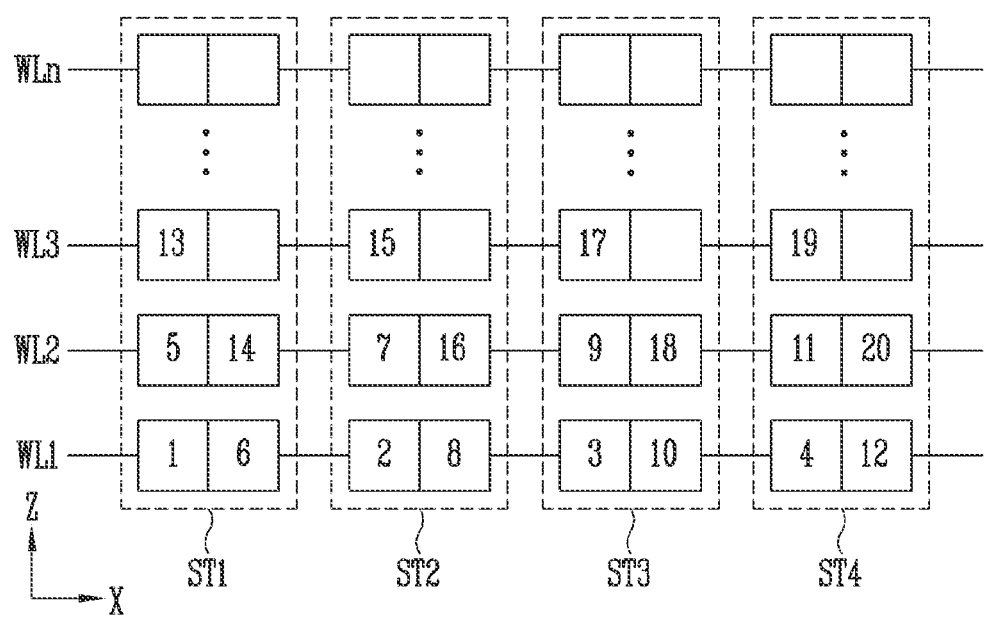

Referring to FIG. 11C, the program operation may be continuously performed in a method identically to the method described with reference to FIG. 11B. That is, after the second program operation may be performed on the physical page of the fourth string group ST4 that is connected to the first word line WL1 (12), the first program operation is performed on the physical page of the first string group ST1 that is connected to the third word line WL3 (13), and the second program operation may be performed on the physical page of the first string group ST1 that is connected to the second word line WL2 (14).

Thereafter, the first program operation may be performed on the physical page of the second string group ST2 that is connected to the third word line WL3 (15), and the second program operation may be performed on the physical page of the second string group ST2 that is connected to the second word line WL2 (16).

Thereafter, the first program operation may be performed on the physical page of the third string group ST3 that is connected to the third word line WL3 (17), and the second program operation may be performed on the physical page of the third string group ST3 that is connected to the second word line WL2 (18).

Thereafter, the first program operation may be performed on the physical page of the fourth string group ST4 that is connected to the third word line WL3 (19), and the second program operation may be performed on the physical page of the fourth string group ST4 that is connected to the second word line WL2 (20). The memory system according to an embodiment of the present disclosure may program page data in a method identical to the method described with reference to FIGS. 11A to 11C.

Figure 11D:
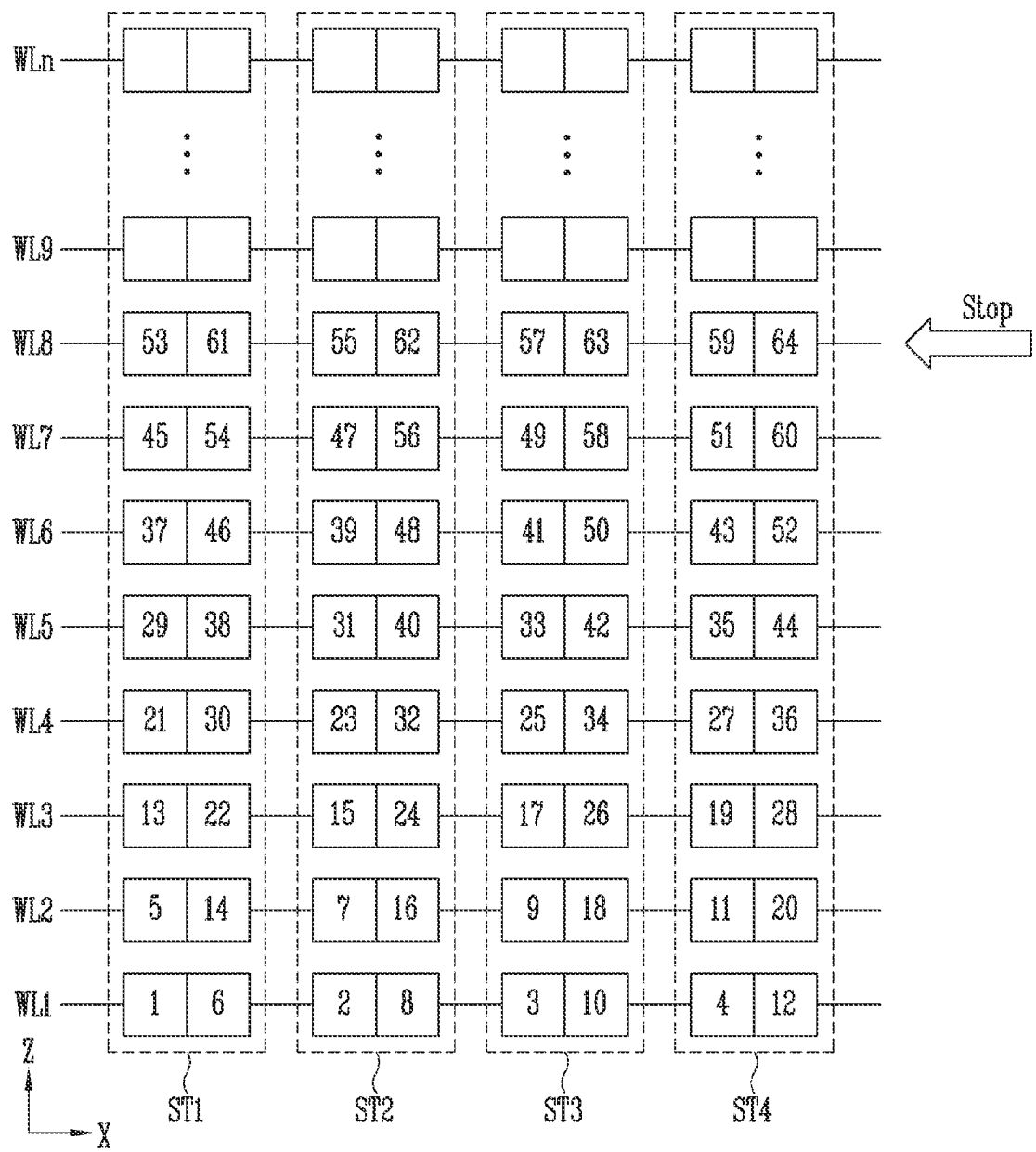

Referring to FIG. 11D, an operation of a case in which the program operation is stopped after programming the physical page that is connected to the eighth word line is shown.

When the program operation is expected to be stopped after the programming of the physical page that is connected to the eighth word line, the memory system may perform the second program operation on the physical page of the fourth string group ST4 that is connected to the seventh word line (60) and then may perform the second program operation on the physical page of the first string group ST1 that is connected to the eighth word line (61) rather than performing the first program operation on the physical page of the first string group ST1 that is connected to the ninth word line. Thereafter, the second program operation may be performed on the physical page of the second string group ST2 that is connected to the eighth word line (62), the second program operation may be performed on the physical page of the third string group ST3 that is connected to the eighth word line (63), and the second program operation may be performed on the physical page of the fourth string group ST4 that is connected to the eighth word line (64). After a sixty-fourth program operation is completed, the data program operation may be stopped.

Figure 11E:
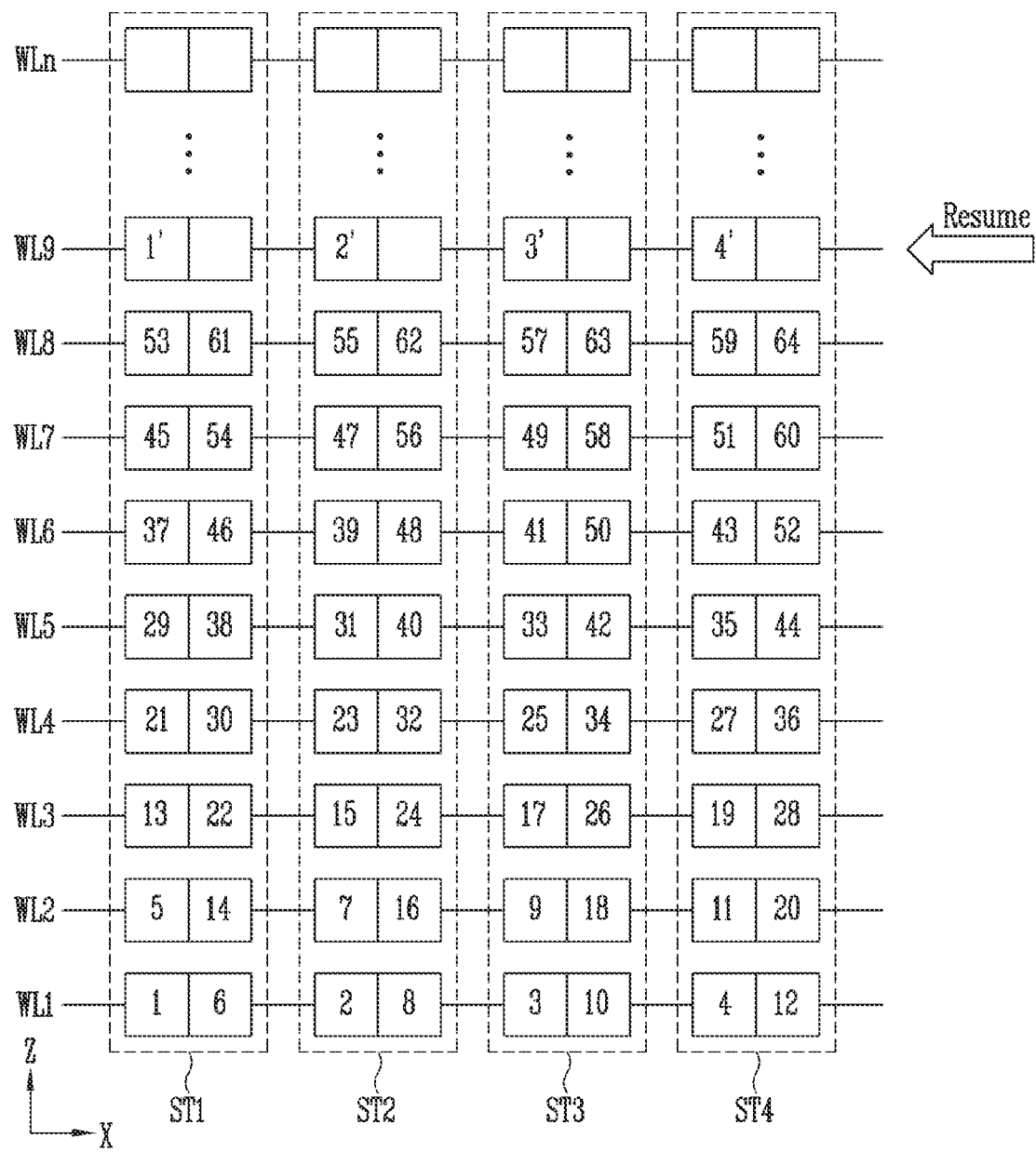

Referring to FIG. 11E, an operation of a case in which the program operation is resumed after the program operation is stopped as explained with FIG. 11D is shown. In this case, the program operation may be performed from the physical pages that are connected to the ninth word line. More specifically, after the first program operation is performed on the physical page of the first string group ST1 that is connected to the ninth word line WL9 (1'), the first program operation may be performed on the physical page of the second string group ST2 that is connected to the ninth word line WL9 (2'). Thereafter, the first program operation may be performed on the physical page of the third string group ST3 that is connected to the ninth word line WL9 (3'), and the first program operation may be performed on the physical page of the fourth string group ST4 that is connected to the ninth word line WL9 (4').

Figure 11F:
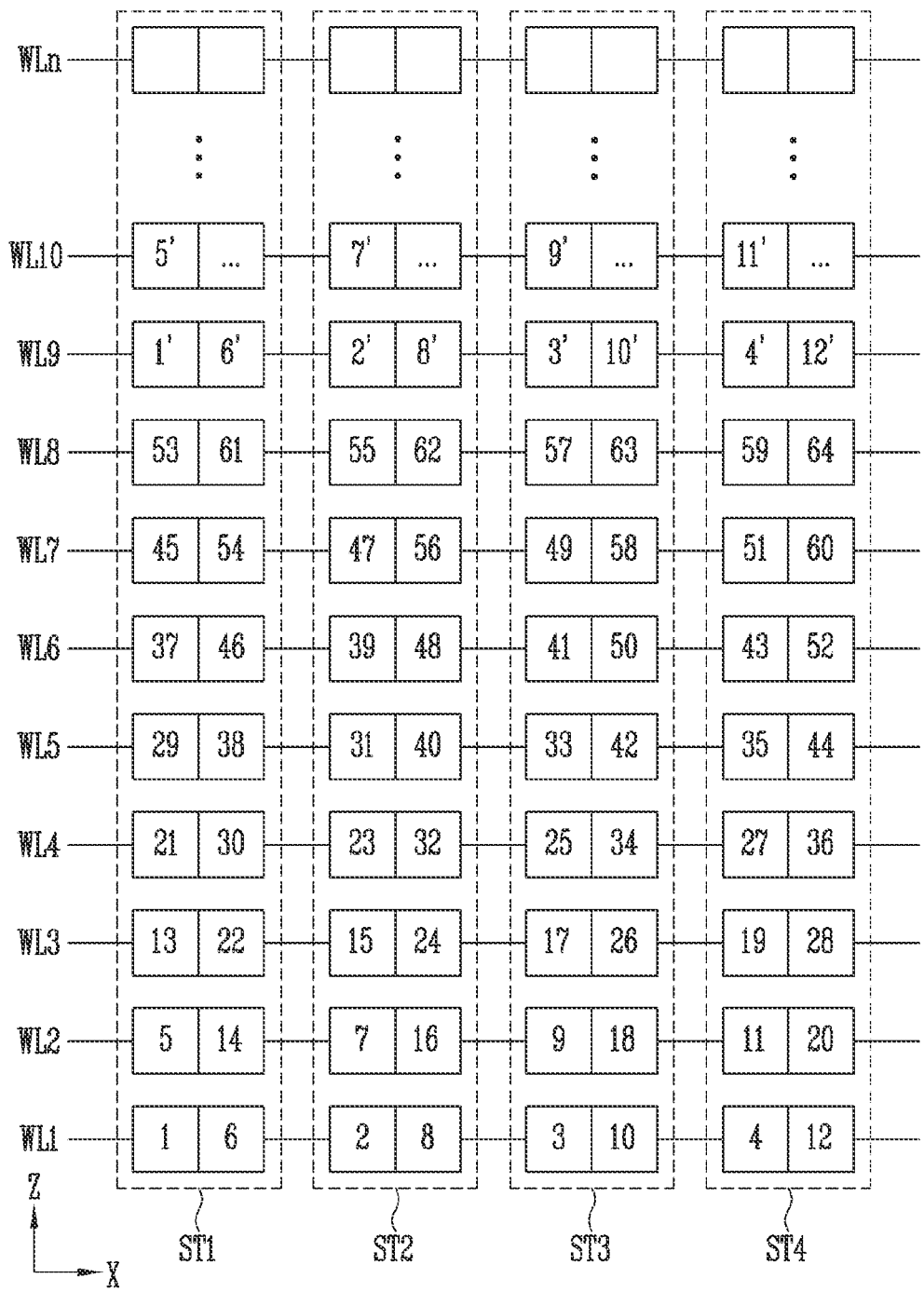

Referring to FIG. 11F, after the first program operation is performed on the physical page of the fourth string group ST4 that is connected to the ninth word line WL9 (4'), the first program operation may be performed on the physical page of the first string group ST1 that is connected to the tenth word line WL10 (5'), and the second program operation may be performed on the physical page of the first string group ST1 that is connected to the ninth word line WL9 (6'). Thereafter, the first program operation may be performed on the physical page of the second string group ST2 that is connected to the tenth word line WL10 (7'), and the second program operation may be performed on the physical page of the second string group ST2 that is connected to the ninth word line WL9 (8').

Thereafter, the first program operation may be performed on the physical page of the third string group ST3 that is connected to the tenth word line WL10 (9'), and the second program operation may be performed on the physical page of the third string group ST3 that is connected to the ninth word line WL9 (10').

In addition, the first program operation may be performed on the physical page of the fourth string group ST4 that is connected to the tenth word line WL10 (11'), and the second program operation may be performed on the physical page of the fourth string group ST4 that is connected to the ninth word line WL9 (12').

That is, when the program operation is resumed after the program operation is stopped, the program operation may be performed on the physical pages that are connected to the ninth word line and the subsequent word line in an order that is similar to a program order that is performed on the physical pages that are connected to the first to eighth word lines.

Referring to FIG. 11F, after the second program operation is performed on the pages that are connected to the eighth word line (61, 62, 63, and 64) as the program operation is stopped, the first and second program operations may be performed on the pages that are connected to the ninth word line (1', 2', 3', 4', 6', 8', 10', and 12') as the program operation is resumed. Accordingly, the threshold voltage distribution of the memory cells that are included in the pages that are connected to the eighth word line may be deteriorated. This becomes a reason that increases a possibility of a read fail when data that is stored in the pages that are connected to the eighth word line is read.

According to a memory system and a method of operating the same according to another embodiment of the present disclosure, when the program operation is stopped, a dummy program operation may be performed on pages that are adjacent to pages in which last program data is to be stored, and thereafter, the second program operation may be performed on the pages in which the last program data is to be stored. Therefore, even though the program operation is resumed afterwards, the possibility that the threshold voltage distribution of the memory cells in which data is already stored is deteriorated may be reduced. Hereinafter, a method of operating a memory system according to another embodiment of the present disclosure is described with reference to FIGS. 12A to 12D.

FIGS. 12A to 12D are diagrams illustrating a method of operating a memory device according to another embodiment of the present disclosure.

Figure 12A:
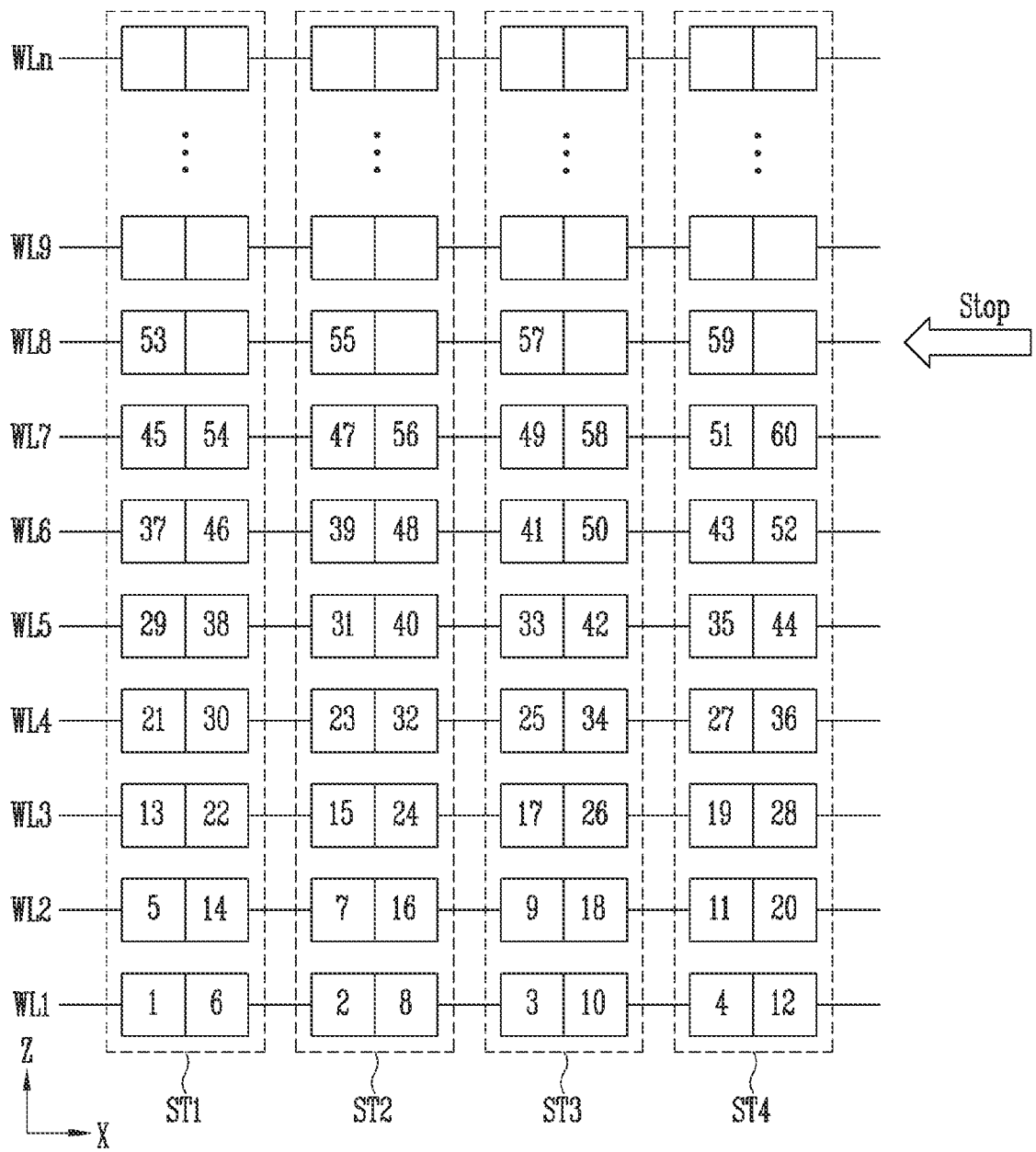
FIGS. 12A to 12D are diagrams illustrating a method of operating a memory device according to another embodiment of the present disclosure.

Referring to FIG. 12A, a situation in which the first program operation may be performed on the physical pages that are connected to the eighth word line WL8 (53, 55, 57, 59), and the second program operation may be performed on the physical pages that are connected to the seventh word line WL7 (54, 56, 58, 60) is shown. The program order of the physical pages that are connected to the first to seventh word lines WL1 to WL7 is substantially the same as that described with reference to FIGS. 11A to 11F.

Figure 12B:
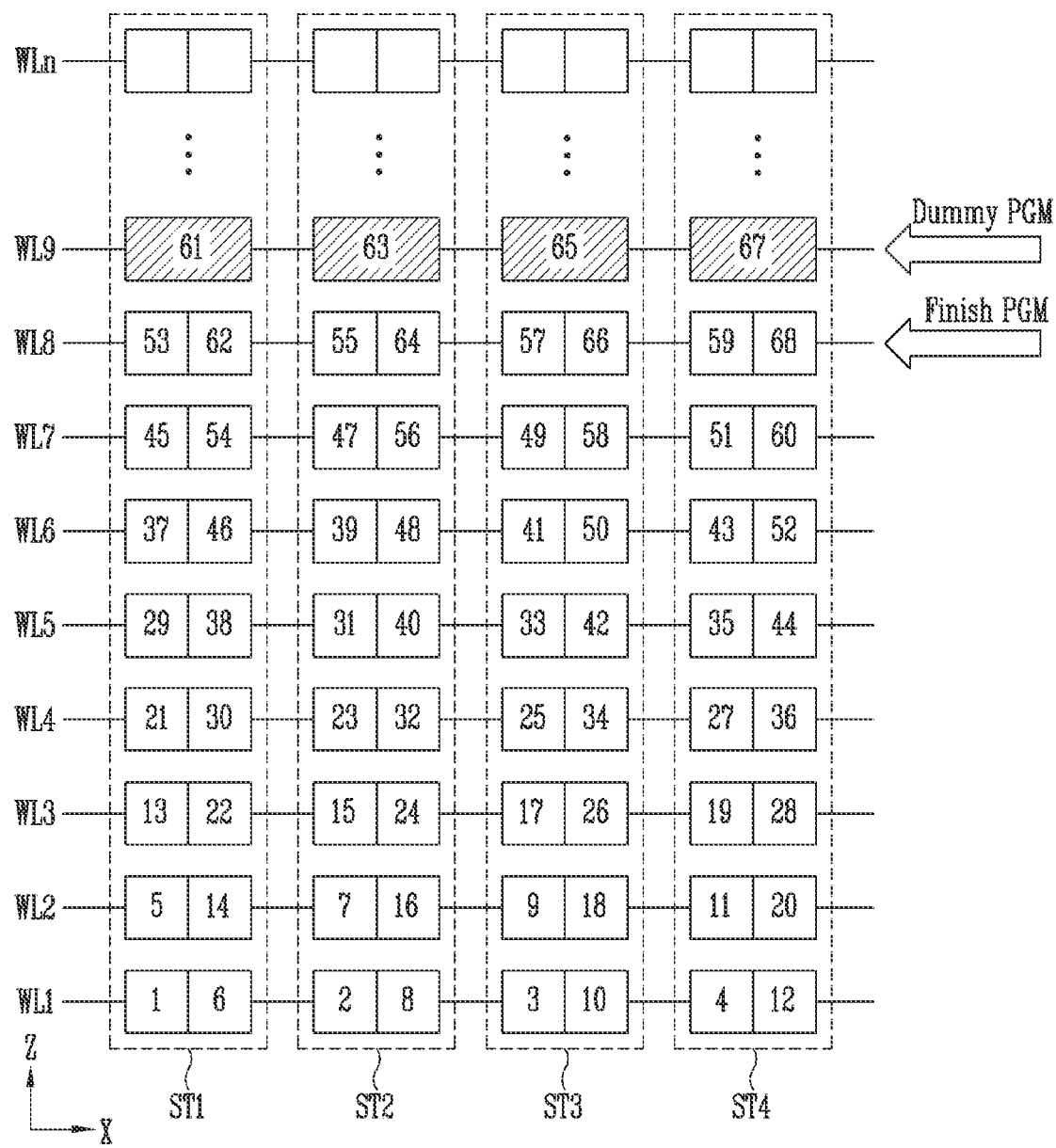

Referring to FIG. 12A, an operation of a case in which the program operation is stopped after programming the physical page that is connected to the eighth word line is shown. Referring to FIG. 12B, when the program operation of the physical page that is connected to the eighth word line is expected to be stopped, the memory system may perform the second program operation on the physical page of the fourth string group ST4 that is connected to the seventh word line (60) and then may program dummy data in the physical page of the first string group ST1 that is connected to the ninth word line (61). Thereafter, the memory system may perform the second program operation on the physical page of the first string group ST1 that is connected to the eighth word line (62).

Thereafter, the memory system may program the dummy data in the physical page of the second string group ST2 that is connected to the ninth word line (63) and may perform the second program operation on the physical page of the second string group ST2 that is connected to the eighth word line (64).

Thereafter, the memory system may program the dummy data in the physical page of the third string group ST3 that is connected to the ninth word line (65) and may perform the second program operation on the physical page of the third string group ST3 that is connected to the eighth word line (66).

Thereafter, the memory system may program the dummy data in the physical page of the fourth string group ST4 that is connected to the ninth word line (67) and may perform the second program operation on the physical page of the fourth string group ST4 that is connected to the eighth word line (68).

Figure 12C:
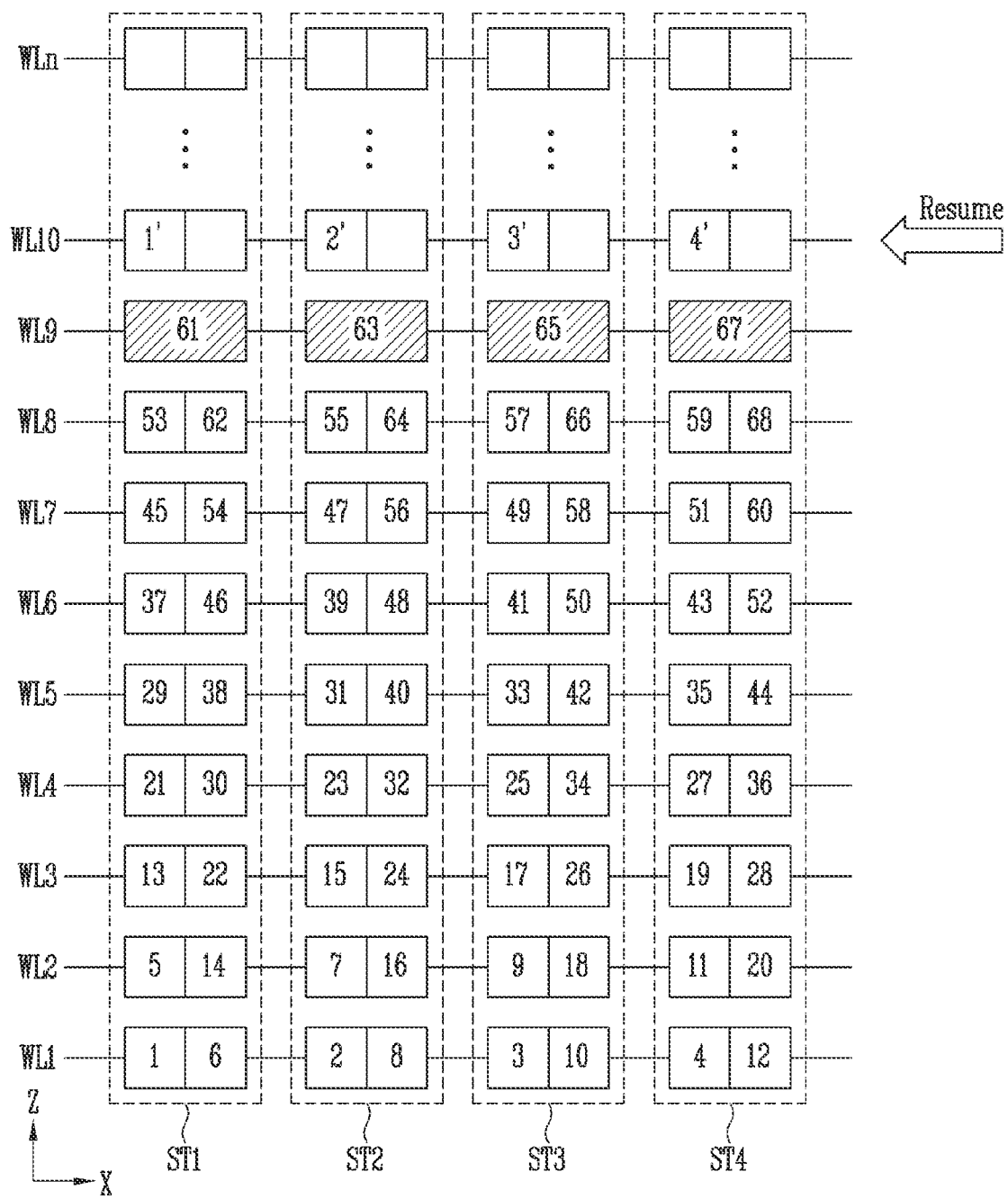

Referring to FIG. 12C, an operation of a case in which the program operation is resumed is shown. In this case, the program operation may be performed from the physical pages that are connected to the tenth word line. More specifically, the first program operation may be performed on the physical page of the first string group ST1 that is connected to the tenth word line WL10 (1'), and the first program operation may be performed on the physical page of the second string group ST2 that is connected to the tenth word line WL10 (2'). Thereafter, the first program operation may be performed on the physical page of the third string group ST3 that is connected to the tenth word line WL10 (3'), and the first program operation may be performed on the physic& page of the fourth string group ST4 that is connected to the tenth word line WL10 (4').

Figure 12D:
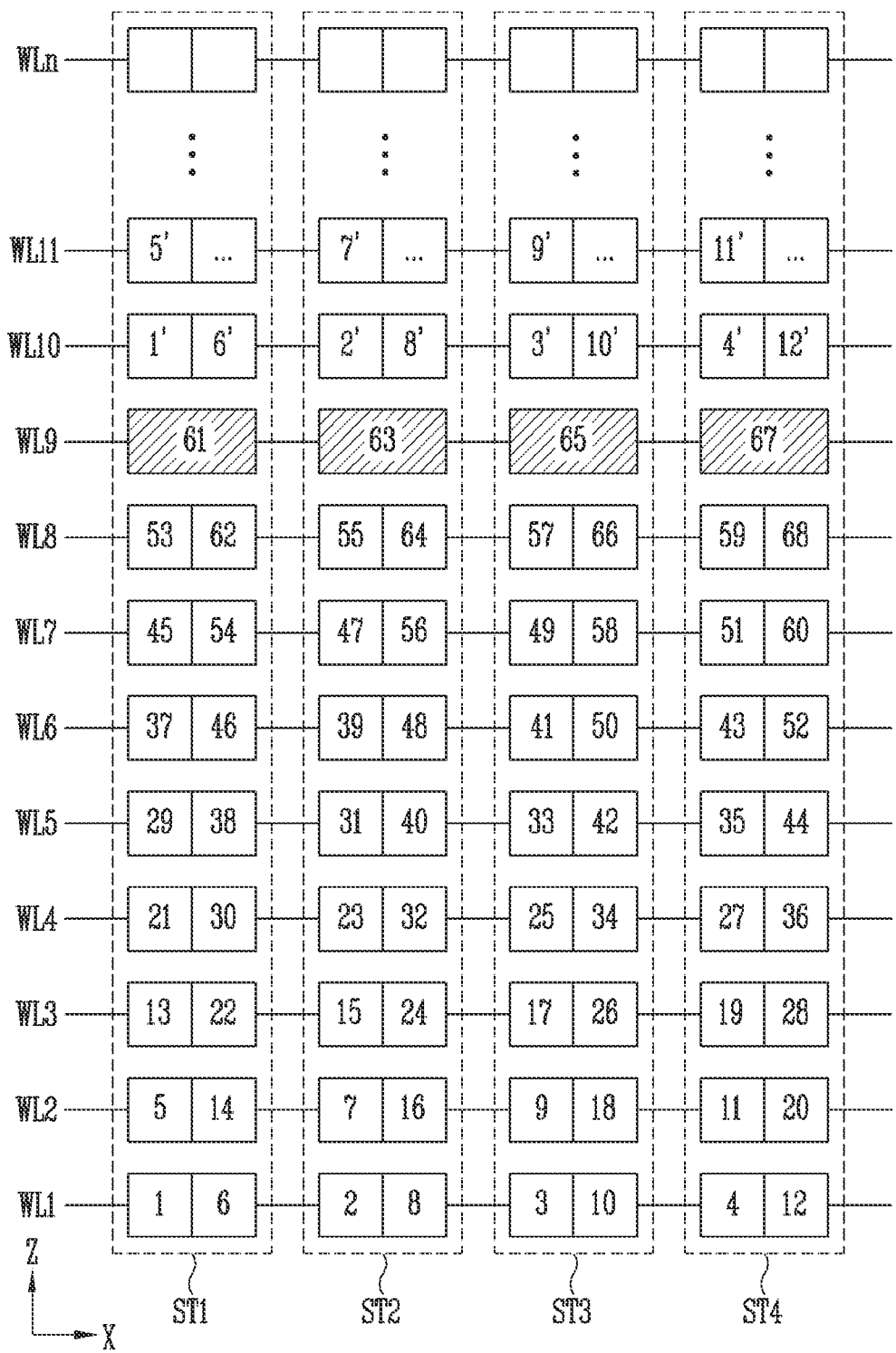

Referring to FIG. 12D, after the first program operation is performed on the physical page of the fourth string group ST4 that is connected to the tenth word line WL10 (4'), the first program operation may be performed on the physical page of the first string group ST1 that is connected to the eleventh word line WL11 (5'), and the second program operation may be performed on the physical page of the first string group ST1 that is connected to the tenth word line WL10 (6'). Thereafter, the first program operation may be performed on the physical page of the second string group ST2 that is connected to the eleventh word line WL11 (7'), and the second program operation may be performed on the physical page of the second string group ST2 that is connected to the tenth word line WL10 (8').

Thereafter, the first program operation may be performed on the physical page of the third string group ST3 that is connected to the eleventh word line WL11 (9'), and the second program operation may be performed on the physical page of the third string group ST3 that is connected to the tenth word line WL10 (10').

In addition, the first program operation may be performed on the physical page of the fourth string group ST4 that is connected to the eleventh word line WL11 (11'), and the second program operation may be performed on the physical page of the fourth string group ST4 that is connected to the tenth word line WL10 (12').

That is, when the program operation is resumed after the program operation is stopped, the program operation may be performed on the physical pages that are connected to the tenth word line and the subsequent word line in an order that is similar to a program order that is performed on the physical pages that are connected to the first to eighth word lines.

Referring to FIG. 12B, after the first program operation is performed on the pages that are connected to the eighth word line (53, 55, 57, and 59) as the program operation is stopped, the dummy program operation may be performed on the pages that are connected to the ninth word line (61, 63, 65, and 67), and the second program operation may be performed on the physical pages that are connected to the eighth word line after each dummy program operation (62, 64, 66, and 68). Accordingly, even though the first and second program operations are performed on the pages that are connected to the tenth word line after resuming the program (1', 2', 4', 6', 8', 10', and 12'), a possibility that the threshold voltage distribution of memory cells that are included in the pages that are connected to the eighth word line is deteriorated is reduced.

That is, according to the memory system and the method of operating the same according to another embodiment of the present disclosure, when the program operation is stopped, the dummy program operation may be performed on the pages adjacent to the pages in which the last program data is to be stored, and thereafter, the second program operation may be performed on the pages in which the last program data is to be stored. Therefore, even though the program operation is resumed afterward, the possibility that the threshold voltage distribution of the memory cells in which data is already stored is deteriorated may be reduced.

Figure 13:
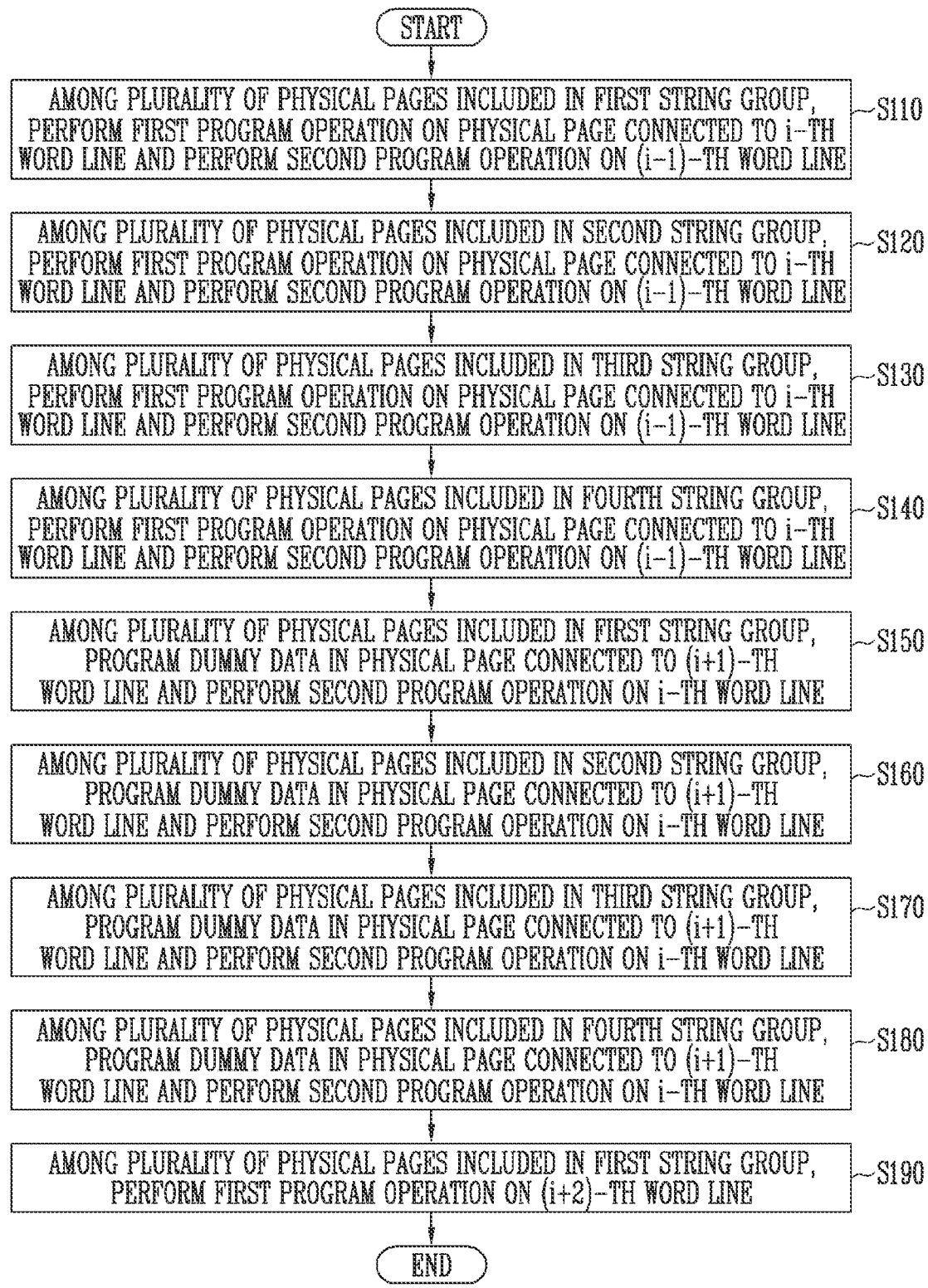
FIG. 13 is a flowchart illustrating the method of operating the memory device described with reference to FIGS. 12A to 12D.

FIG. 13 is a flowchart illustrating the method of operating the memory device described with reference to FIGS. 12A to 12D. Hereinafter, the method shown in FIG. 13 is described with reference to FIGS. 12A to 12D together. In FIGS. 12A to 12D, when the program operation is stopped, the physical page storing the last data is the physical page that is connected to the eighth word line WL8. Accordingly, for convenience of description, a case where i is 8 in FIG. 13 is described.

In step S110, among the plurality of physical pages that are included in the first string group ST1, the first program operation may be performed on a physical page that is connected to an i-th word line, and the second program operation may be performed on a physical page that is connected to an (i−1)-th word line. Referring to FIGS. 12A to 12D, among the plurality of physical pages that are included in the first string group ST1, the first program operation may be performed on the physical page that is connected to the eighth word line WL8 (53), and the second program operation may be performed on the physical page that is connected to the seventh word line WL7 (54).

In step S120, among the plurality of physical pages that are included in the second string group ST2, the first program operation may be performed on the physical page that is connected to the i-th word line, and the second program operation may be performed on the physical page that is connected to the (i−1)-th word line. Referring to FIGS. 12A to 12D, among the plurality of physical pages that are included in the second string group ST2, the first program operation may be performed on the physical page that is connected to the eighth word line WL8 (55), and the second program operation may be performed on the physical page that is connected to the seventh word line WL7 (56).

In step S130, among the plurality of physical pages that are included in the third string group ST3, the first program operation may be performed on the physical page that is connected to the i-th word line, and the second program operation may be performed on the physical page that is connected to the (i−1)-th word line. Referring to FIGS. 12A to 12D, among the plurality of physical pages that are included in the third string group ST3, the first program operation may be performed on the physical page that is connected to the eighth word line WL8 (57), and the second program operation may be performed on the physical page that is connected to the seventh word line WL7 (58).

In step S140, among the plurality of physical pages that are included in the fourth string group ST4, the first program operation may be performed on the physical page that is connected to the i-th word line, and the second program operation may be performed on the physical page that is connected to the (i−1)-th word line. Referring to FIGS. 12A to 12D, among the plurality of physical pages that are included in the fourth string group ST4, the first program operation may be performed on the physical page that is connected to the eighth word line WL8 (59), and the second program operation may be performed on the physical page that is connected to the seventh word line WL7 (60).

Thereafter, in step S150, among the plurality of physical pages that are included in the first string group ST1, the dummy data may be programmed in a physical page that is connected to an (i+1)-th word line, and the second program operation may be performed on the physical page that is connected to the i-th word line. Referring to FIGS. 12A to 12D, among the plurality of physical pages that are included in the first string group ST1, the dummy program operation may be performed on the physical page that is connected to the ninth word line WL9 (61), and the second program operation may be performed on the physical page that is connected to the eighth word line WL8 (62).

In step S160, among the plurality of physical pages that are included in the second string group ST2, the dummy data may be programmed in the physical page that is connected to the (i+1)-th word line, and second program operation may be performed on the physical page that is connected to the i-th word line. Referring to FIGS. 12A to 12D, among the plurality of physical pages that are included in the second string group ST2, the dummy program operation may be performed on the physical page that is connected to the ninth word line WL9 (63), and the second program operation may be performed on the physical page that is connected to the eighth word line WL8 (64).

In step S170, among the plurality of physical pages that are included in the third string group ST3, the dummy data may be programmed in the physical page that is connected to the (i+1)-th word line, and the second program operation may be performed on the physical page that is connected to the i-th word line. Referring to FIGS. 12A to 12D, among the plurality of physical pages that are included in the third string group ST3, the dummy program operation may be performed on the physical page that is connected to the ninth word line WL9 (65), and the second program operation may be performed on the physical page that is connected to the eighth word line WL8 (66).

In step S180, among the plurality of physical pages that are included in the fourth string group ST4, the dummy data may be programmed in the physical page that is connected to the (i+1)-th word line, and the second program operation may be performed on the physical page that is connected to the i-th word line. Referring to FIGS. 12A to 12D, among the plurality of physical pages that are included in the fourth string group ST4, the dummy program operation may be performed on the physical page that is connected to the ninth word line WL9 (67), and the second program operation may be performed on the physical page that s connected to the eighth word line WL8 (68).

Thereafter, in step S190, among the plurality of physical pages that are included in the first to fourth string groups, the first program operation may be performed on each of physical pages that are connected to an (i+2)-th word line. Referring to FIGS. 12A to 12D, as the program operation is resumed, the first program operation may be performed on the physical pages that are connected to the tenth word line WL10 (1', 2', 3', and 4').

FIGS. 14A to 14G are diagrams illustrating a method of operating a memory device according to another embodiment of the present disclosure.

Figure 14A:
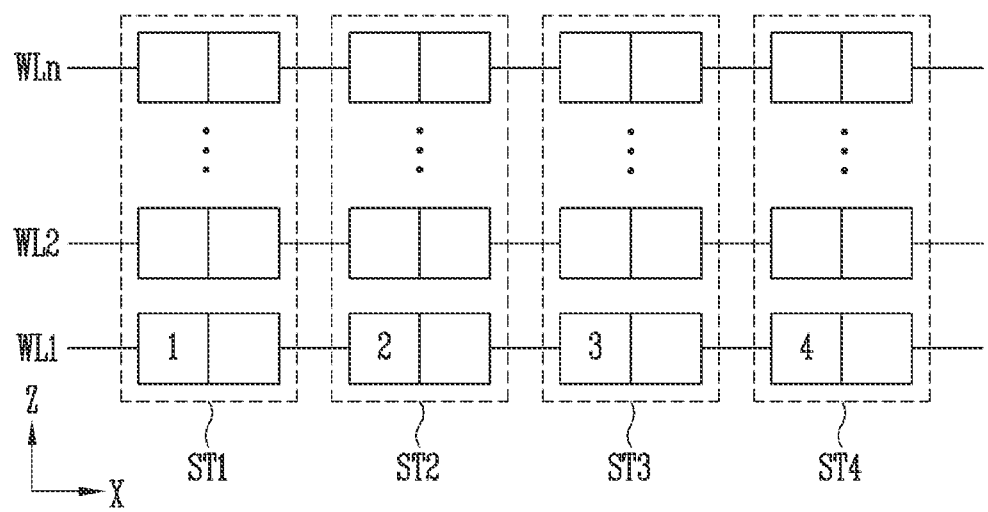
FIGS. 14A to 14G are diagrams illustrating a method of operating a memory device according to another embodiment of the present disclosure.

Referring to FIG. 14A, after the first program operation is performed on the physical page of the first string group ST1 that is connected to the first word line WL1 (1), the first program operation may be performed on the physical page of the second string group ST2 that is connected to the first word line WL1 (2), the first program operation may be performed on the physical page of the third string group ST3 that is connected to the first word line WL1 (3), and the first program operation may be performed on the physical page of the fourth string group ST4 that is connected to the first word line WL1 (4). That is, the first program operation may be sequentially performed on the physical pages of the first to fourth string groups ST1 to ST4 that are connected to the first word line WL1.

Figure 14B:
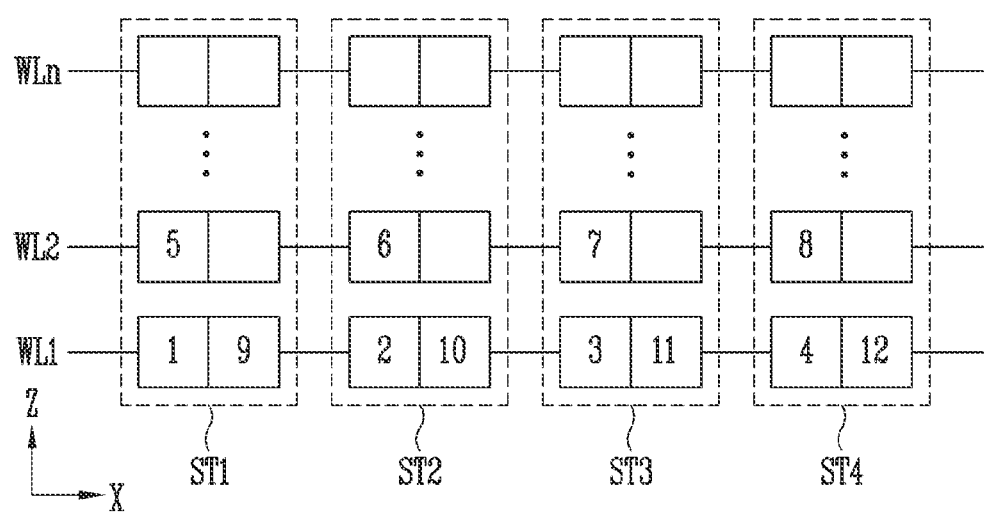

Referring to FIG. 14B, after the first program operation is performed (4) on the physical page of the fourth string group ST4 that is connected to the first word line WL1, the first program operation may be performed on the physical page of the first string group ST1 that is connected to the second word line WL2 (5), the first program operation may be performed on the physical page of the second string group ST2 that is connected to the second word line WL2 (6), the first program operation may be performed on the physical page of the third string group ST3 that is connected to the second word line WL2 (7), and the first program operation may be performed on the physical page of the fourth string group ST4 that is connected to the second word line WL2 (8). That is, after the first program operation is sequentially performed on the physical pages of the first to fourth string groups ST1 to ST4 that are connected to the first word line WL1 (1, 2, 3, and 4), the first program operation may be sequentially performed on the physical pages of the first to fourth string groups ST1 to ST4 that are connected to the second word line WL2 (5, 6, 7, and 8).

Referring again to FIG. 14B, after the first program operation is sequentially performed on the physical pages of the first to fourth string groups ST1 to ST4 that are connected to the second word line WL2 (5, 6, 7, and 8), the second program operation may be sequentially performed on the physical pages of the first to fourth string groups ST1 to ST4 that are connected to the first word line WL1 (9, 10, 11, and 12).

Figure 14C:
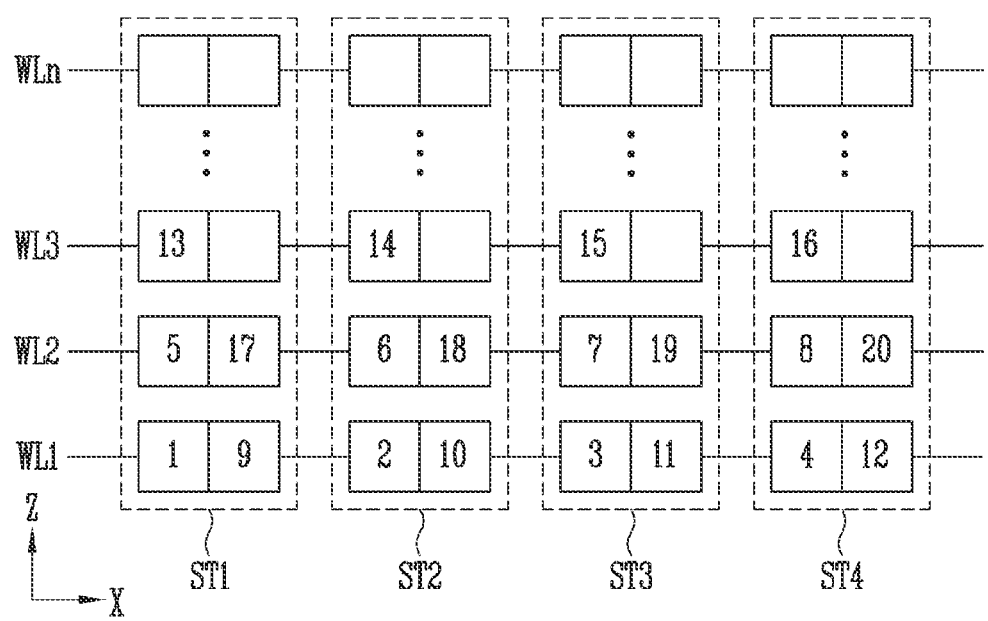

Referring to FIG. 14C, after the second program operation is sequentially performed on the physical pages of the first to fourth string groups ST1 to ST4 that are connected to the first word line WL1 (9, 10, 11, and 12), the first program operation may be sequentially performed on the physical pages of the first to fourth string groups ST1 to ST4 that are connected to the third word line WL3 (13, 14, 15, and 16), and the second program operation may be sequentially performed on the physical pages of the first to fourth string groups ST1 to ST4 that are connected to the second word line WL2 (17, 18, 19, and 20). In such a method, the physical pages that are connected to the first to seventh word lines WL1 to WL7 may be programmed in the re-program method.

Figure 14D:
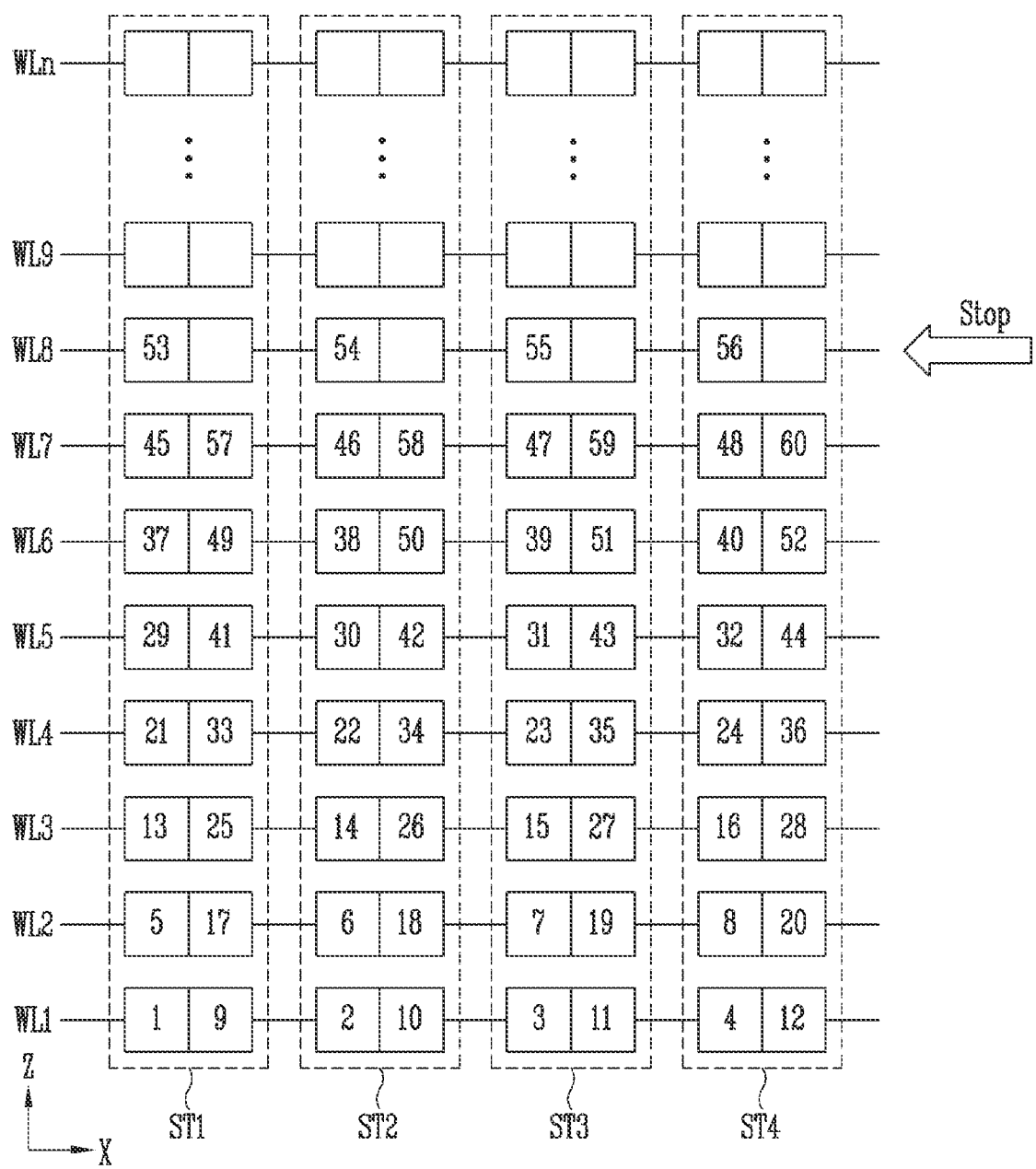

Referring to FIG. 14D, a situation in which the first program operation is sequentially performed on the physical pages of the first to fourth string groups ST1 to ST4 that are connected to the eighth word line WL8 (53, 54, 55, and 56), and the second program operation is sequentially performed on the physical pages of the first to fourth string groups ST1 to ST4 that are connected to the seventh word line WL7 (57, 58, 59, and 60) is shown. In this situation, after the program of the physical page that is connected to the eighth word line WL8, the program operation may be stopped.

Figure 14E:
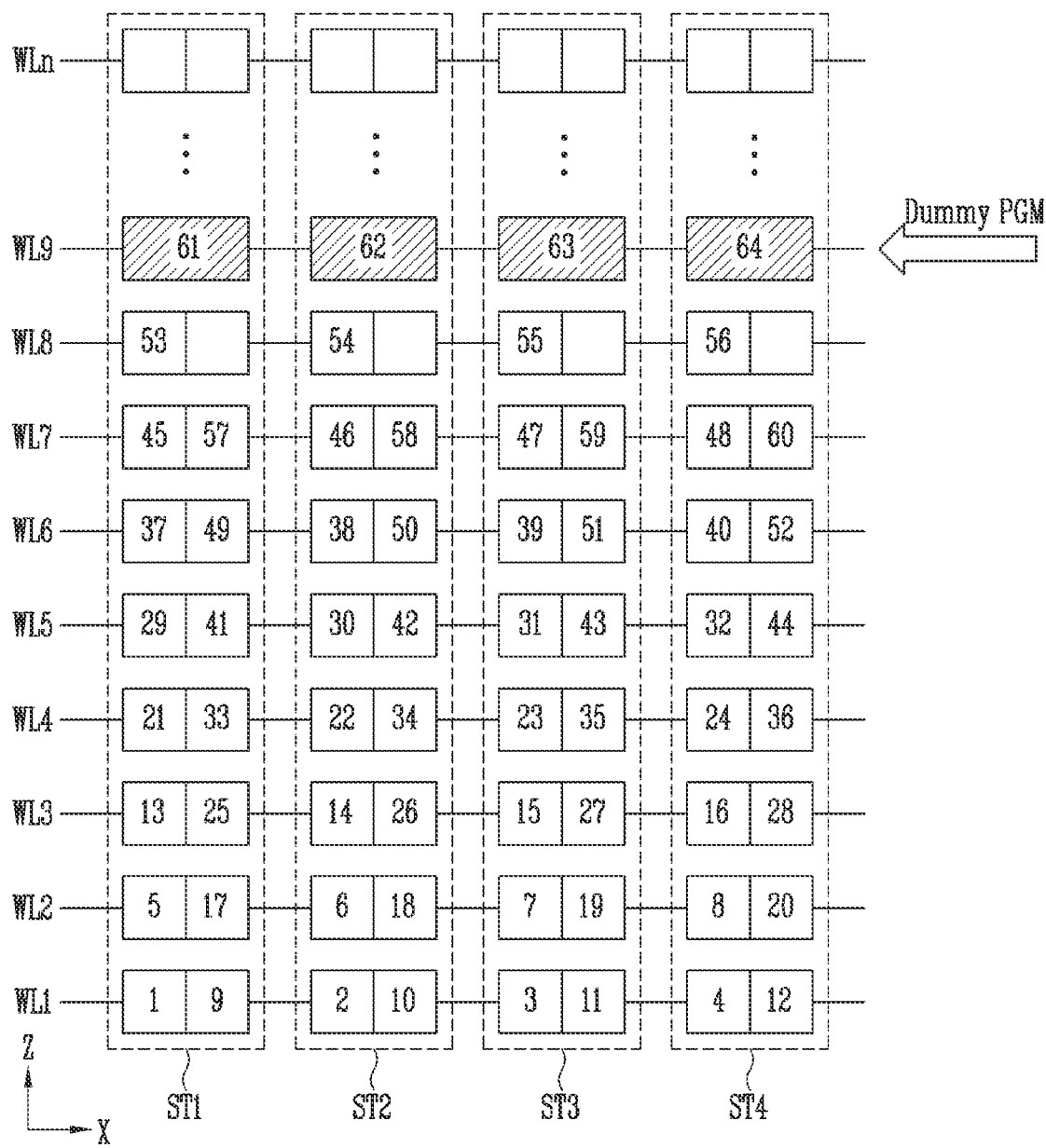

Referring to FIG. 14E, when the program operation is expected to be stopped after the program of the physical page that is connected to the eighth word line WL8, the memory system may sequentially perform the second program operation on the physical pages of the first to fourth string groups ST1 to ST4 that are connected to the seventh word line WL7 (57, 58, 59, and 60) and then program the dummy data in the physical pages of the first to fourth string groups ST1 to ST4 that are connected to the ninth word line WL9 (61, 62, 63, and 64).

Figure 14F:
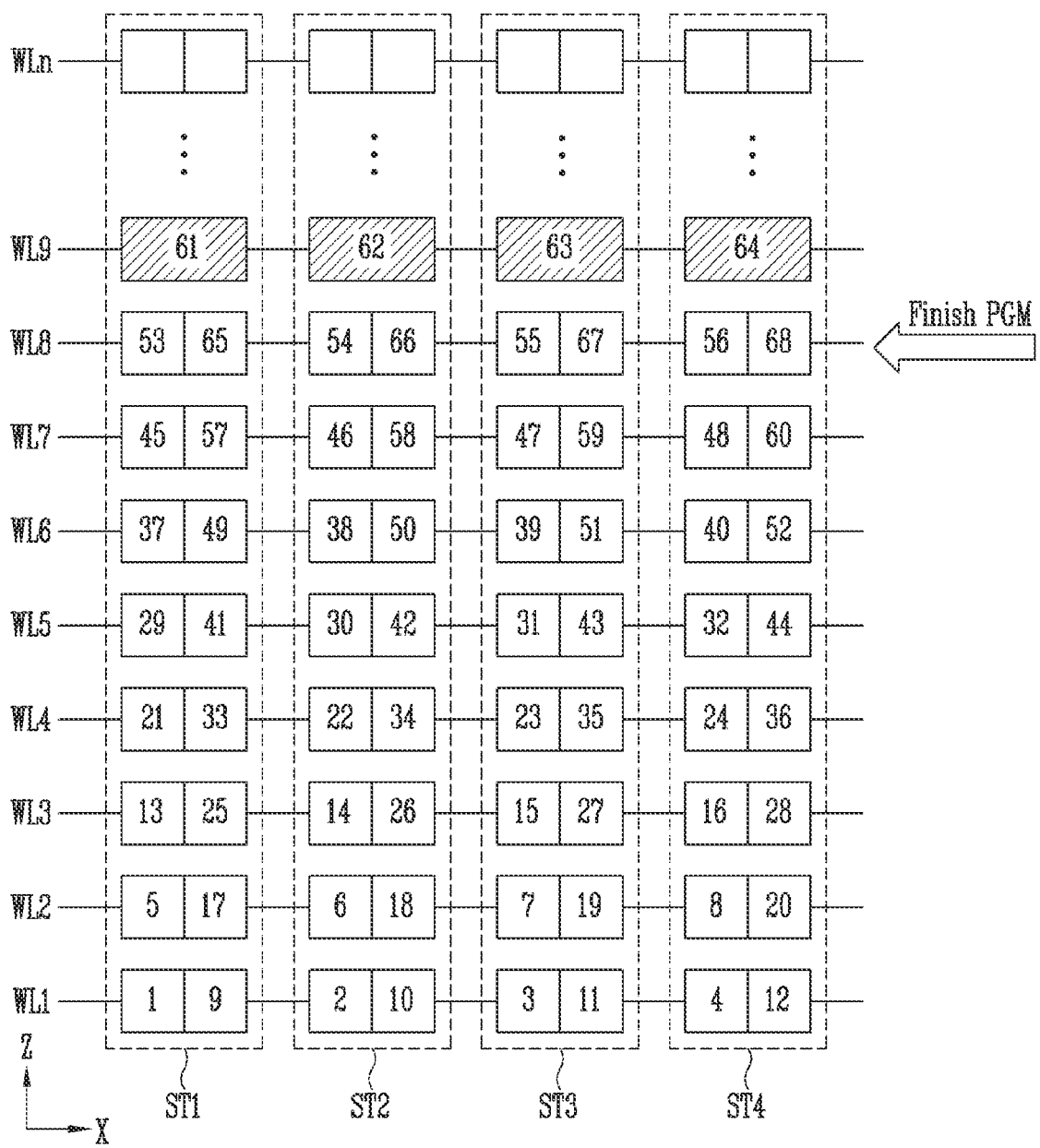

Referring to FIG. 14F, after the dummy program operation is performed on the physical pages of the first to fourth string groups ST1 to ST4 that are connected to the ninth word line WL9 (61, 62, 63, and 64), the second program operation may be sequentially performed on the physical pages of the first to fourth string groups ST1 to ST4 that are connected to the eighth word line WL8 (65, 66, 67, and 68).

Figure 14G:
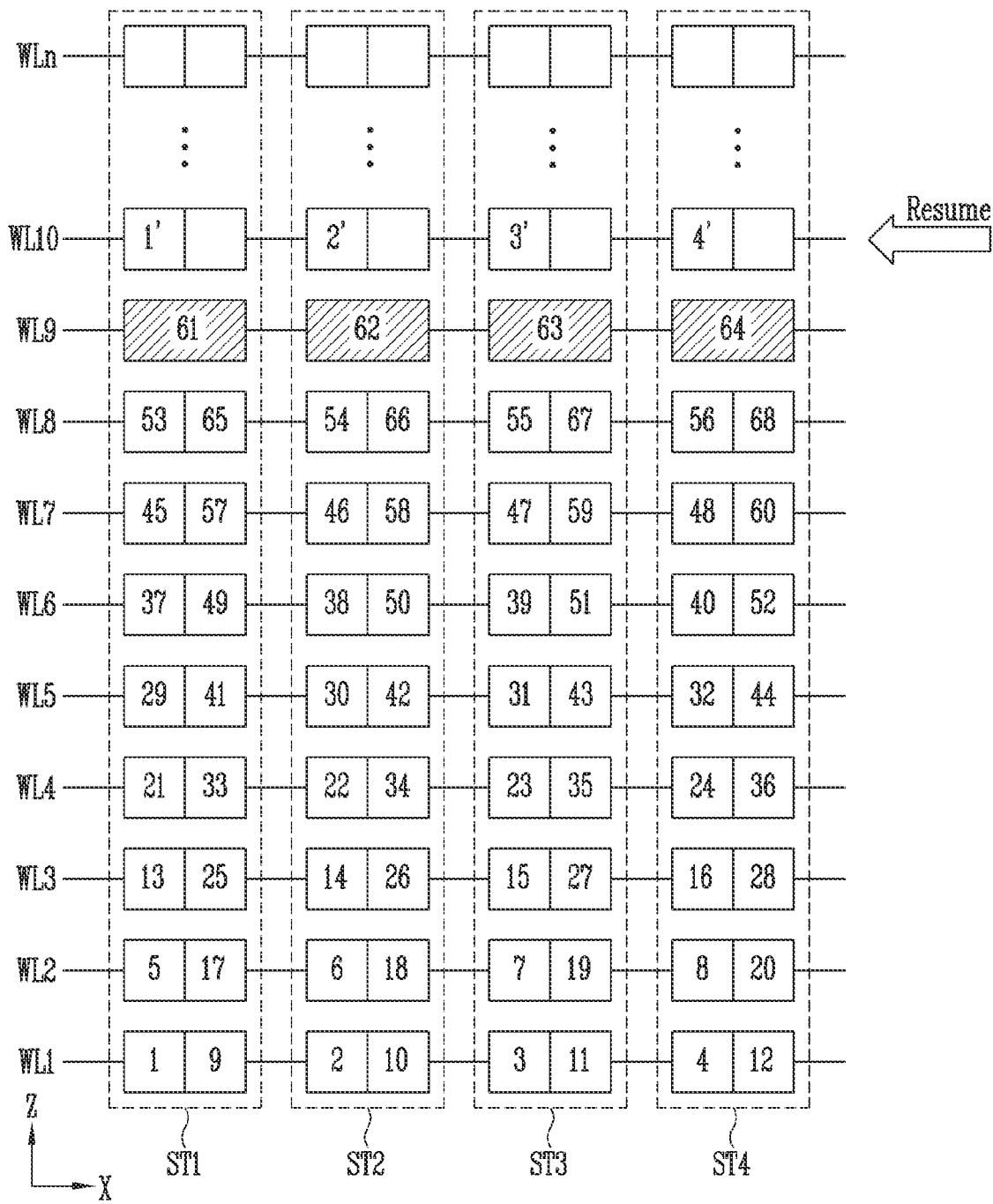

Referring to FIG. 14G, as the program operation is resumed, the first program operation may be sequentially performed on the physical pages of the first to fourth string groups ST1 to ST4 that are connected to the tenth word line WL10 (1', 2', 3', and 4').

Figure 15:
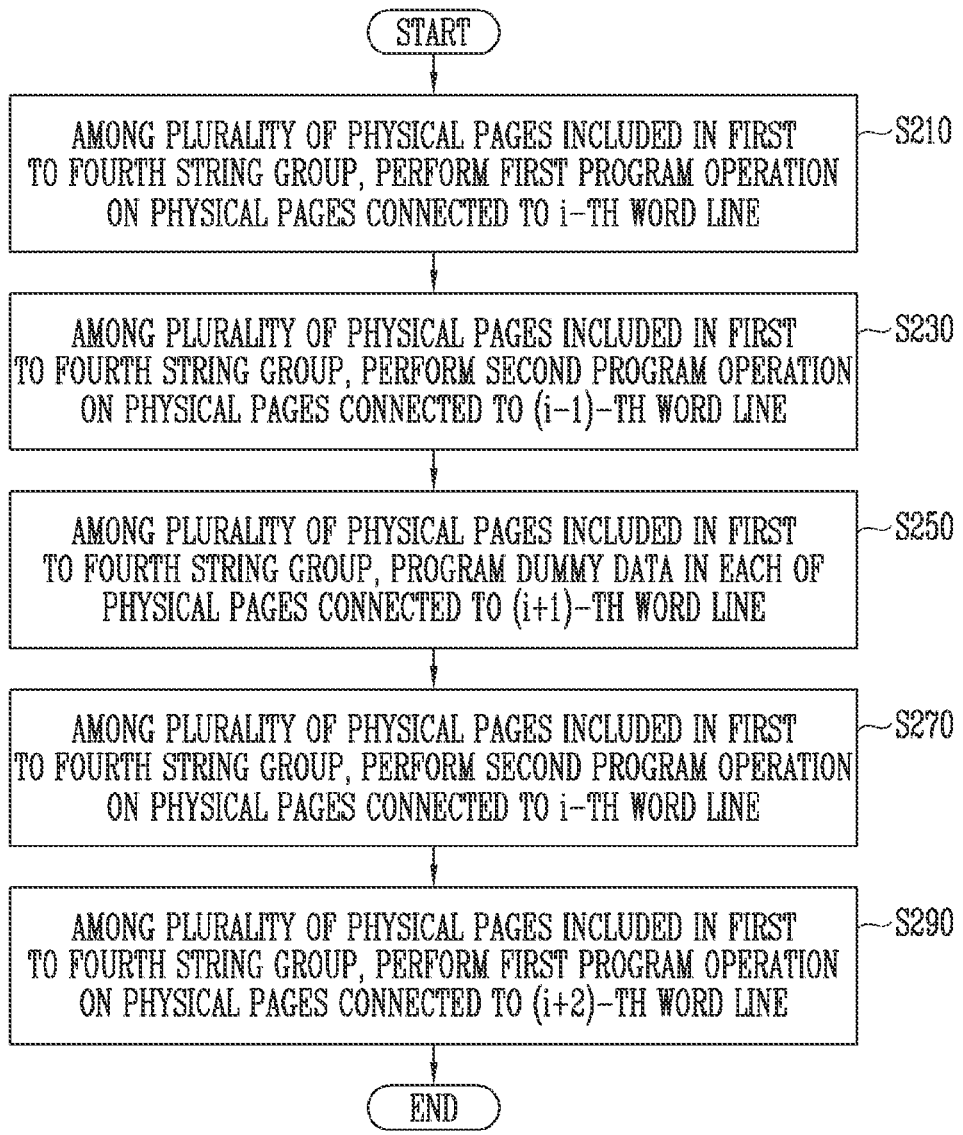
FIG. 15 is a flowchart illustrating the method of operating the memory device described with reference to FIGS. 14A to 14G.

FIG. 15 is a flowchart illustrating the method of operating the memory device described with reference to FIGS. 14A to 14G. Hereinafter, the method, shown in FIG. 15, is described with reference to FIGS. 14A to 14G together. In FIGS. 14A to 14G, when the program operation is stopped, the physical page that stores the last data may be the physical page that is connected to the eighth word line WL8. Accordingly, for convenience of description, a case where i is 8 in FIG. 15 is described.

In step S210, among the plurality of physical pages that are included in the first to fourth string groups ST1 to ST4, the first program operation may be performed on the physical pages that are connected to the i-th word line. Referring to FIGS. 14A to 14G, among the plurality of physical pages that are included in the first to fourth string groups ST1 to ST4, the first program operation may be performed on the physical pages that are connected to the eighth word line WL8 (53, 54, 55, and 56).

Thereafter, in step S230, among the plurality of physical pages that are included in the first to fourth string groups, the second program operation may be performed on the physical pages that are connected to the (−1)-th word line. Referring to FIGS. 14A to 14G, among the plurality of physical pages that are included in the first to fourth string groups ST1 to ST4, the second program operation may be performed on the physical pages that are connected to the seventh word line WL7 (57, 58, 59, and 60).

Thereafter, in step S250, among the plurality of physical pages that are included in the first to fourth string groups, the dummy data may be programmed in each of the physical pages that are connected to the (i+1)-th word line. Referring to FIGS. 14A to 14G, among the plurality of physical pages that are included in the first to fourth string groups ST1 to ST4, the dummy program operation may be performed on the physical pages that are connected to the ninth word line WL9 (61, 62, 63, and 64).

Thereafter, in step S270, among the plurality of physical pages that are included in the first to fourth string groups, the second program operation may be performed on the physical pages that are connected to the i-th word line. Referring to FIGS. 14A to 14G, among the plurality of physical pages that are included in the first to fourth string groups ST1 to ST4, the second program operation may be performed on the physical pages that are connected to the eighth word line WLS (65, 66, 67, and 68).

Thereafter, in step S290, among the plurality of physical pages that are included in the first to fourth string groups ST1 to ST4, the first program operation may be performed on the physical pages that are connected to the (i+2)-th word line. Referring to FIGS. 14A to 14G, among the plurality of physical pages that are included in the first to fourth string groups ST1 to ST4, the first program operation may be performed on the physical pages that are connected to the tenth word line WL10 (1', 2', 3', and 4').

Figure 16:
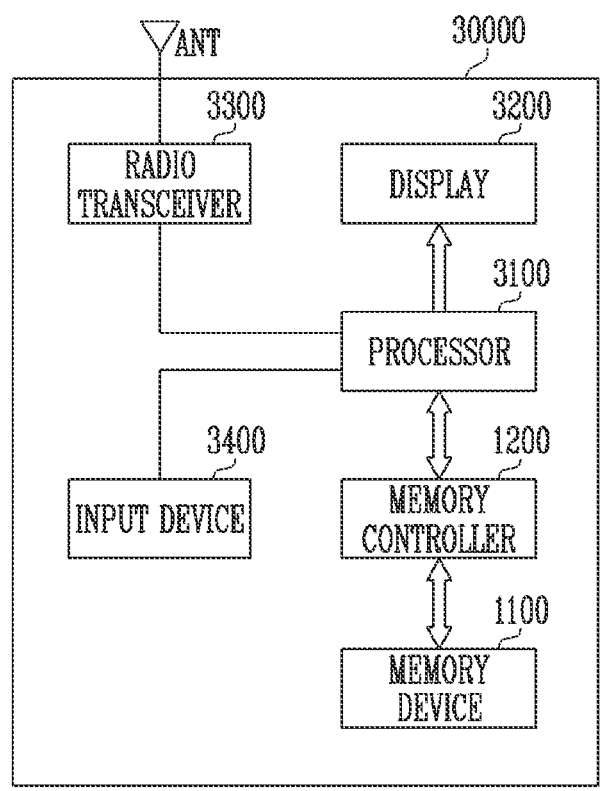
FIG. 16 is a diagram illustrating another embodiment of a memory system including the memory device shown in FIG. 2.

FIG. 16 is a diagram illustrating another embodiment of the memory system including the memory device shown in FIG. 2.

Referring to FIG. 16, the memory system 30000 may be implemented as a cellular phone, a smart phone, a tablet PC, a personal digital assistant (PDA) or a wireless communication device. The memory system 30000 may include the memory device 1100 and the memory controller 1200 that is capable of controlling the operation of the memory device 1100. The memory controller 1200 may control a data access operation, for example, a program operation, an erase operation, or a read operation, of the memory device 1100 based on a processor 3100.

Data that is programmed in the memory device 1100 may be output through a display 3200 based on the memory controller 1200.

A radio transceiver 3300 may transmit and receive a radio signal through an antenna ANT. For example, the radio transceiver 3300 may convert a radio signal that is received through the antenna ANT into a signal that may be processed by the processor 3100. Therefore, the processor 3100 may process the signal that is output from the radio transceiver 3300 and transmit the processed signal to the memory controller 1200 or the display 3200. The memory controller 1200 may program the signal that is processed by the processor 3100 to the memory device 1100. In addition, the radio transceiver 3300 may convert a signal that is output from the processor 3100 into a radio signal and output the converted radio signal to an external device through the antenna ANT. An input device 3400 may be a device that is capable of inputting a control signal for controlling the operation of the processor 3100 or data to be processed by the processor 3100. The input device 3400 may be implemented as a pointing device, such as a touch pad or a computer mouse, a keypad, or a keyboard. The processor 3100 may control an operation of the display 3200 so that data that is output from the memory controller 1200, data that is output from the radio transceiver 3300, or data that is output from the input device 3400 is output through the display 3200.

According to an embodiment, the memory controller 1200 that is capable of controlling the operation of memory device 1100 may be implemented as a part of the processor 3100 and may also be implemented as a chip separate from the processor 3100.

Figure 17:
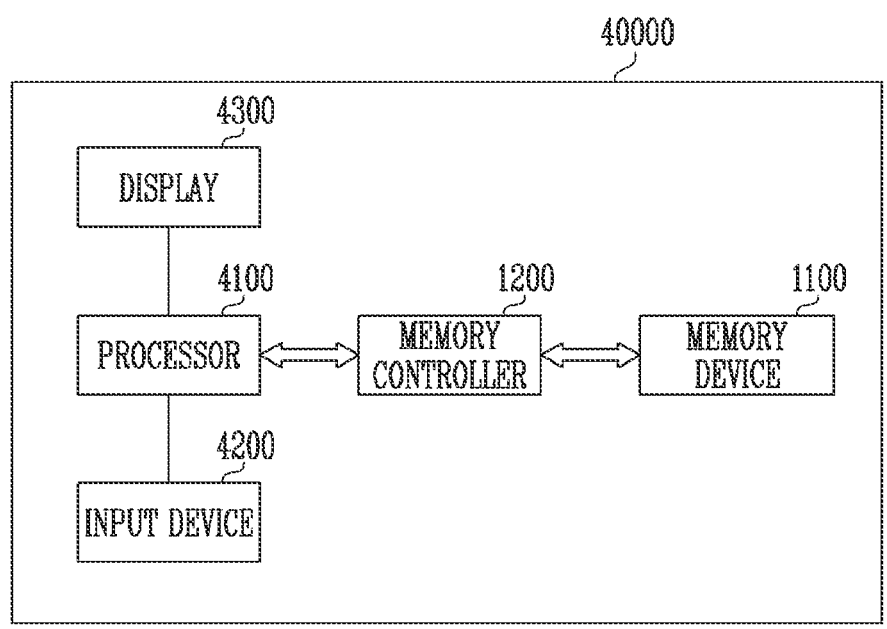
FIG. 17 is a diagram illustrating another embodiment of the memory system including the memory device shown in FIG. 2.

FIG. 17 is a diagram illustrating another embodiment of the memory system including the memory device shown in FIG. 2.

Referring to FIG. 17, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 that is capable of controlling a data process operation of the memory device 1100.

A processor 4100 may output data that is stored in the memory device 1100 through a display 4300, according to data that is input through an input device 4200. For example, the input device 4200 may be implemented as a point device, such as a touch pad or a computer mouse, a keypad, or a keyboard.

The processor 4100 may control the overall operation of the memory system 40000 and control the operation of the memory controller 1200. According to an embodiment, the memory controller 1200 that is capable of controlling the operation of memory device 1100 may be implemented as a part of the processor 4100 or may be implemented as a chip separate from the processor 4100.

Figure 18:
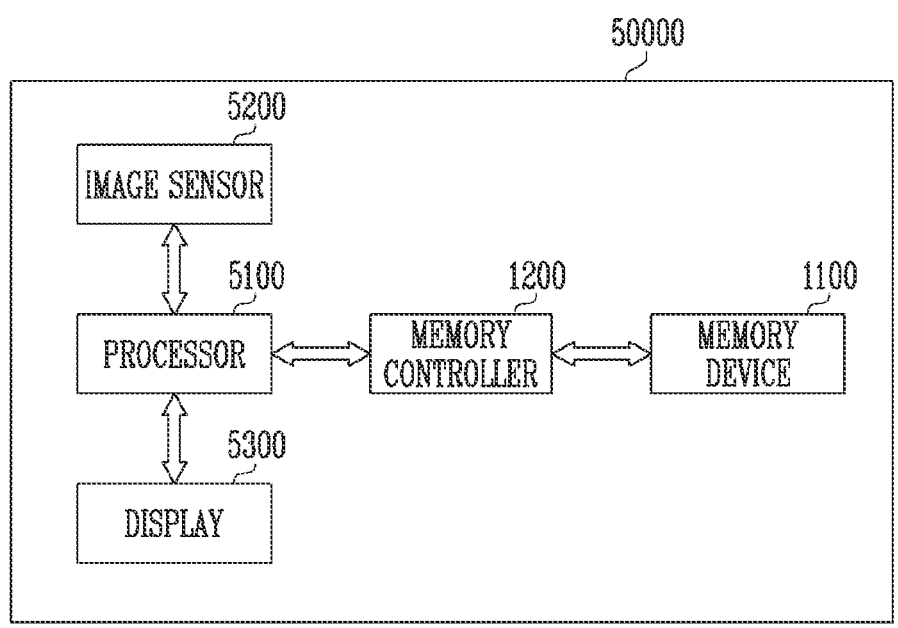
FIG. 18 is a diagram illustrating another embodiment of the memory system including the memory device shown in FIG. 2.

FIG. 18 is a diagram illustrating another embodiment of the memory system including the memory device shown in FIG. 2.

Referring to FIG. 18, the memory system 50000 may be implemented as an image processing device, for example, a digital camera, a portable phone provided with a digital camera, a smart phone provided with a digital camera, or a tablet PC provided with a digital camera.

The memory system 50000 may include the memory device 1100 and the memory controller 1200 that is capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Based on the processor 5100, the converted digital signals may be output through a display 5300 or stored in the memory device 1100 through the memory controller 1200. In addition, data that is stored in the memory device 1100 may be output through the display 5300 based on the processor 5100 or the memory controller 1200.

According to an embodiment, the memory controller 1200 that is capable of controlling the operation of memory device 1100 may be implemented as a part of the processor 5100 or may be implemented as a chip separate from the processor 5100.

Figure 19:
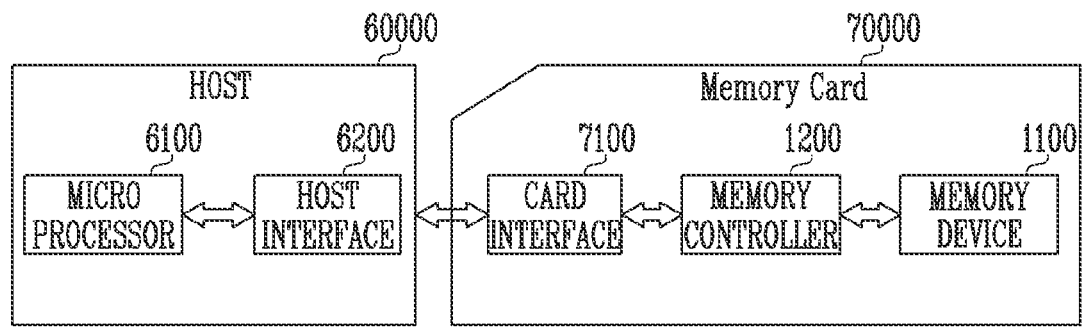
FIG. 19 is a diagram illustrating another embodiment of the memory system including the memory device shown in FIG. 2.

FIG. 19 is a diagram illustrating another embodiment of the memory system including the memory device shown in FIG. 2.

Referring to FIG. 19, the memory system 70000 may be implemented as a memory card or a smart card. The memory system 70000 may include the memory device 1100, the memory controller 1200, and a card interface 7100.

The memory controller 1200 may control data exchange between the memory device 1100 and the card interface 7100. According to an embodiment, the card interface 7100 may be a secure digital (SD) card interface or a multi-media card (MMC) interface, but is not limited thereto.

The card interface 7100 may interface data exchange between a host 60000 and the memory controller 1200 according to a protocol of the host 60000. According to an embodiment, the card interface 7100 may support a universal serial bus (USB) protocol, and an interchip (IC)-USB protocol. Here, the card interface may refer to hardware that is capable of supporting a protocol that is used by the host 60000, software installed in the hardware, or a signal transmission method.

When the memory system 70000 is connected to a host interface 6200 of the host 60000, such as a PC, a tablet PC, a digital camera, a digital audio player, a mobile phone, a console video game hardware, or a digital set-top box, the interface 6200 may perform data communication with the memory device 1100 through the card interface 7100 and the memory controller 1200 based on a microprocessor 6100.

The embodiments of the present disclosure disclosed in the present specification and drawings are merely provided with specific examples to easily describe the technical content of the present disclosure and to help understanding of the present disclosure, and are not intended to limit the scope of the present disclosure. It is obvious to those of ordinary skill in the art that other modified examples based on the technical spirit of the present disclosure may be implemented in addition to the embodiments disclosed herein.

What is claimed is:

1. A memory device comprising:
a memory block including a plurality of string groups respectively connected to a corresponding select line, among a plurality of select lines;
a peripheral circuit configured to perform a first program operation and a second program operation on the memory block; and
a control logic configured to control the program operation of the peripheral circuit,
wherein the memory block is connected to first to n-th word lines,
wherein the control logic is configured to control the peripheral circuit to perform the first program operation on a physical page, among a plurality of physical pages that are included in a first string group, connected to the i-th word line, perform the second program operation on a physical page that is connected to the (i−1)-th word line, perform the first program operation on a physical page, among a plurality of physical pages that are included in a second string group, connected to the (i+1)-th word line, perform a dummy program operation on a physical page, among the plurality of physical pages that are included in the first string group, connected to the (i+1)-th word line, perform the second program operation on the physical page that is connected to the i-th word line, perform the dummy program operation on a physical page, among the plurality of physical pages that are included in the second string group, connected to the (i+1)-th word line, and perform the second program operation on the physical page that is connected to the i-th word line, and
wherein n is a natural number equal to or greater than 3, and i is a natural number greater than 0 and less than n−1.

2. The memory device of claim 1, wherein the first program operation is an operation of programming a threshold voltage of a memory cell to a first target level, and
wherein the second program operation is an operation of programming the threshold voltage of the memory cell to a second target level.

3. The memory device of claim 2, wherein the first target level is a level that is lower than the second target level.

4. The memory device of claim 3, wherein the control logic is configured to control the peripheral circuit to perform the second program operation on the physical page that is connected to the i-th word line after performing the dummy program operation on the physical page that is connected to the (i+1)-th word line.

5. The memory device of claim 4, wherein the control logic is configured to control the peripheral circuit to perform the first program operation on a physical page that is connected to an (i+2)-th word line after performing the second program operation on the physical page that is connected to the i-th word line.

6. The memory device of claim 1, wherein the control logic controls the peripheral circuit to sequentially perform the first program operation on physical pages, among the plurality of physical pages that are included in the first string group and the second string group, connected to an (i+2)-th word line, after performing the second program operation on the physical, among the plurality of physical pages that are included in the second string group, page connected to the i-th word line.

7. The memory device of claim 1, wherein the control logic controls the peripheral circuit to sequentially perform the first program operation on physical pages, among a plurality of physical pages that are included in the first string group and a second string group, connected to the i-th word line, sequentially perform the second program operation on physical pages, among the plurality of physical pages that are included in the first string group and the second string group, connected to the (i−1)-th word line, sequentially perform the dummy program operation on physical pages, among the plurality of physical pages that are included in the first string group and the second string group, connected to the (i+1)-th word line, and sequentially perform the second program operation on physical pages, among the plurality of physical pages that are included in the first string group and the second string group, connected to the i-th word line.

8. The memory device of claim 7, wherein the control logic controls the peripheral circuit to sequentially perform the first program operation on physical pages, among the plurality of physical pages that are included in the first string group and the second string group, connected to an (i+2)-th word line, after sequentially performing the second program operation on the physical pages, among the plurality of physical pages that are included in the first string group and the second string group, connected to the i-th word line.

9. A method of operating a memory system that performs a first program operation and a second program operation on a memory block including a plurality of string groups respectively connected to a corresponding select line, among a plurality of select lines and wherein the memory block is connected to first to n-th word lines, the method comprising:
performing a first program operation on a memory cell connected to an i-th word line among memory cells included in a first string group and performing a second program operation on a memory cell connected to an (i−1)-th word line among the memory cells included in a first string group;
performing the first program operation on a memory cell connected to the i-th word line among memory cells included in a second string group and performing the second program operation on a memory cell connected to the (i−1)-th word line among the memory cells included in the second string group; and
performing a dummy program operation on a memory cell connected to an (i+1)-th word line among the memory cells included in the first string group,
wherein i is a natural number greater than 2.

10. The method of claim 9, wherein the first program operation is an operation of programming a threshold voltage of a memory cell to a first target level, and
wherein the second program operation is an operation of programming the threshold voltage of the memory cell to a second target level.

11. The method of claim 10, wherein the first target level is a level that is lower than the second target level.

12. The method of claim 9, further comprising:
performing the dummy program operation on a memory cell connected to an (i+1)-th word line among the memory cells included in the second string group, after performing the dummy program operation on the memory cell connected to the (i+1)-th word line among the memory cells included in the second string group.

* * * * *